US012028993B2

United States Patent
Akiba et al.

(10) Patent No.: US 12,028,993 B2
(45) Date of Patent: Jul. 2, 2024

(54) ELECTRONIC DEVICE

(71) Applicant: Hitachi Astemo, Ltd., Hitachinaka (JP)

(72) Inventors: Ryo Akiba, Hitachinaka (JP); Yoshio Kawai, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 263 days.

(21) Appl. No.: 17/595,423

(22) PCT Filed: Jun. 2, 2020

(86) PCT No.: PCT/JP2020/021705
§ 371 (c)(1),
(2) Date: Nov. 16, 2021

(87) PCT Pub. No.: WO2020/250747
PCT Pub. Date: Dec. 17, 2020

(65) Prior Publication Data
US 2022/0240395 A1 Jul. 28, 2022

(30) Foreign Application Priority Data
Jun. 11, 2019 (JP) .................. 2019-108726

(51) Int. Cl.
*H05K 5/00* (2006.01)
*H01R 12/71* (2011.01)
(Continued)

(52) U.S. Cl.
CPC ......... *H05K 5/0069* (2013.01); *H01R 12/716* (2013.01); *H01R 13/5202* (2013.01);
(Continued)

(58) Field of Classification Search
USPC ...................................... 361/752
See application file for complete search history.

(56) References Cited

U.S. PATENT DOCUMENTS 9,103,889 B1* 8/2015 Fukushima .......... G01R 33/341
2008/0236963 A1* 10/2008 Yasukawa .......... H01R 13/6215
361/624

(Continued)

FOREIGN PATENT DOCUMENTS

JP 2-89886 U 7/1990
JP 2008-181371 A 8/2008
(Continued)

OTHER PUBLICATIONS

International Search Report (PCT/ISA/210) issued in PCT Application No. PCT/JP2020/021705 dated Sep. 29, 2020 with English translation (five (5) pages).
(Continued)

*Primary Examiner* — Hung S. Bui
(74) *Attorney, Agent, or Firm* — Crowell & Moring LLP

(57) ABSTRACT

Provided is an electronic device capable of enhancing salt damage resistance. An electronic device includes a circuit board 3 on which an electronic component 2 is mounted, a housing 4 that houses the circuit board 3, a connector 5 that is mounted on the circuit board 3 and is exposed to an outside of the housing via a first opening portion 4a of the housing 4, a cover member 6 that constitutes a part of a case 131 of an external device 103 to hold the housing 4, and has a second opening portion 66a to which the connector 5 is fitted, and a seal member 8 that is interposed between the connector 5 and the cover member 6, and liquid-tightly seals the case 131 of the external device 103. The housing 4 has a first wall portion 18 extending toward the cover member 6 so as to cover a part of the connector 5 at a distance, and the cover member 6 has a second barrier portion 68 extending toward the housing 4 so as to cover a part of the connector 5 at a distance.

32 Claims, 13 Drawing Sheets

(51) Int. Cl.
      *H01R 13/52*     (2006.01)
      *H05K 5/06*      (2006.01)

(52) U.S. Cl.
      CPC ............ *H05K 5/0056* (2013.01); *H05K 5/06* (2013.01); *H01R 2201/26* (2013.01)

(56) References Cited

U.S. PATENT DOCUMENTS

| | | | | |
|---|---|---|---|---|
| 2012/0127677 A1* | 5/2012 | Wakana | ............... | H05K 5/0069 361/752 |
| 2017/0172006 A1 | 6/2017 | Kamoshida et al. | | |
| 2023/0122791 A1* | 4/2023 | Ohara | ................. | H05K 5/0069 361/752 |

FOREIGN PATENT DOCUMENTS

| | | |
|---|---|---|
| JP | 2014-187728 A | 10/2014 |
| JP | 2016-205590 A | 12/2016 |
| JP | 2017-117893 A | 6/2017 |
| JP | 2017-228721 A | 12/2017 |
| WO | WO 2015/146366 A1 | 10/2015 |

OTHER PUBLICATIONS

Japanese-language Written Opinion (PCT/ISA/237) issued in PCT Application No. PCT/JP2020/021705 dated Sep. 29, 2020 (four (4) pages).

\* cited by examiner

ELECTRONIC DEVICE

TECHNICAL FIELD

The present invention relates to an electronic device, and more particularly to an on-vehicle electronic device including a connector.

BACKGROUND ART

In recent years, in automobiles, a size of a space in an engine room has been reduced and narrowed in order to secure a space in a vehicle compartment and increase the number of parts in the engine room. Thus, in a method for mounting an electronic device, a structure that can be mounted in a small space is also necessary. As one of means, a structure in which an electronic device (transmission control device) is directly attached to a transmission and a connector on the electronic device side and a connector on the transmission side are directly fitted to each other has been known (see, for example, PTL 1).

CITATION LIST

Patent Literature

PTL 1: JP 2016-205590 A

SUMMARY OF INVENTION

Technical Problem

The electronic control device described in PTL 1 has a structure in which the connector on the electronic control device side is fitted to the connector on the transmission side protruding from a case surface of the transmission. In this structure, since a position of the connector on the transmission side is fixed, when the electronic control device is fixed to the case of the transmission, a relative position between a position of the connector on the electronic control device side and a position of the connector on the transmission side may deviate due to tolerance or the like. When the connectors are fitted in a state where the positions of the connectors are shifted, there is a concern that an excessive stress is generated in the connectors.

Thus, in order to prevent the excessive stress from being generated in both the connectors when the electronic control device is fixed to the case of the transmission, a structure in which a part of the connector on the electronic control device side is fitted to an opening portion provided in the case of the transmission and then the connector of the electronic control device and the connector on the transmission side are connected is conceivable. In this structure, since the connector on the transmission side is not fixed to the case of the transmission, it is not necessary to worry about the positional deviation due to tolerance or the like.

However, when the structure in which the connector on the electronic control device side is fitted to the opening portion of the case of the transmission is adopted, it is necessary to prevent a liquid from intruding the case of the transmission through a gap between the case of the transmission and the connector of the electronic control device. It is also necessary to prevent leakage of a liquid such as lubricating oil in the case of the transmission to the outside through the gap. Thus, it is necessary to dispose a seal member that seals the gap between the case of the transmission and the connector of the electronic device.

Meanwhile, vehicle parts are necessary to have high salt damage resistance. Since an on-vehicle electronic device may be disposed in the engine room or the like, salt damage caused by a snow melting agent or the like becomes particularly severe. Accordingly, when salt water intrudes into the periphery of the above-described seal member that seals the gap between the case of the transmission and the connector of the electronic device, there is a concern that the seal performance of the seal member deteriorates due to corrosion of an attachment portion of the salt water in the case of the transmission.

The present invention has been made to solve the above problems, and an object thereof is to provide an electronic device capable of enhancing salt damage resistance.

Solution to Problem

The present application includes a plurality of means for solving the problems, and an example thereof includes an electronic device including a circuit board on which an electronic component is mounted, a housing that has a first opening portion, and houses the circuit board, a connector that is mounted on the circuit board, and is exposed to an outside of the housing via the first opening portion of the housing, a cover member that constitutes a part of a case of an external device to hold the housing, and has a second opening portion to which the connector is fitted, and a seal member that is interposed between the connector and the cover member, and liquid-tightly seals the case of the external device. The housing has a first barrier portion extending toward the cover member so as to cover a part of the connector at a distance, and the cover member has a second barrier portion extending toward the housing so as to cover a part of the connector at a distance.

Advantageous Effects of Invention

According to the present invention, the first barrier portion of the housing extending toward the cover member so as to cover a part of the connector and the second barrier portion of the cover member extending toward the housing so as to cover a part of the connector can obstruct the path of the liquid such as salt water toward the seal member interposed between the connector and the cover member and a peripheral portion thereof. Accordingly, the salt damage resistance of the electronic device and the external device holding the electronic device can be enhanced.

Other objects, configurations, and effects will be made apparent in the following descriptions.

DESCRIPTION OF EMBODIMENTS

Hereinafter, embodiments of an electronic device of the present invention will be described with reference to the drawings. The present embodiment has been described in conjunction with an example in which the present invention is applied to a transmission control device.

Figure 1:
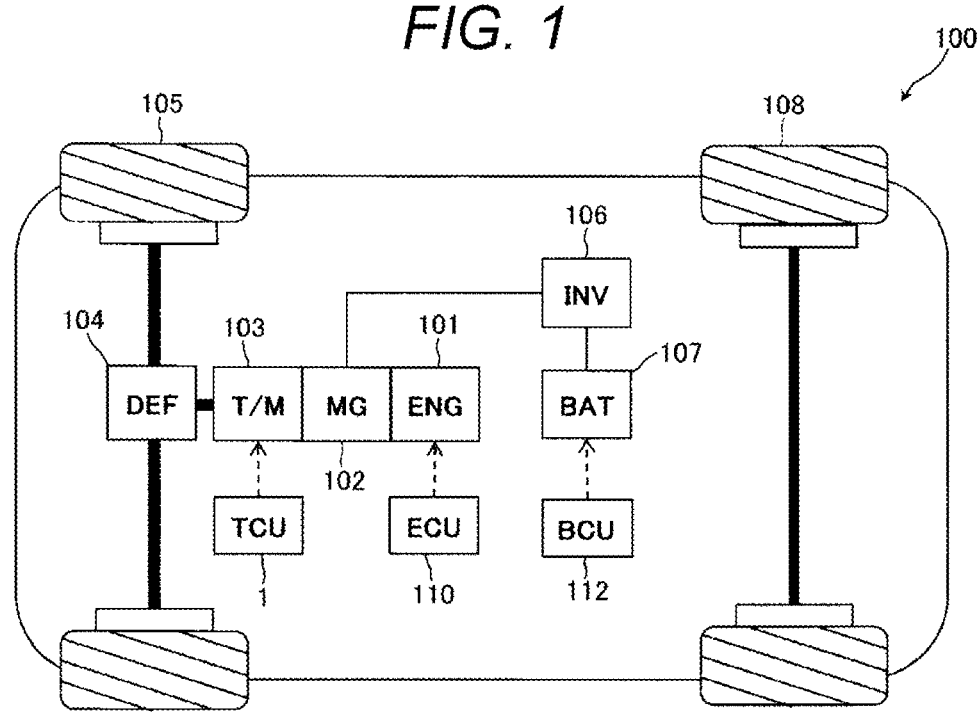
FIG. 1 is a block diagram illustrating a configuration of a vehicle including an electronic device according to a first embodiment of the present invention.
Figure 2:
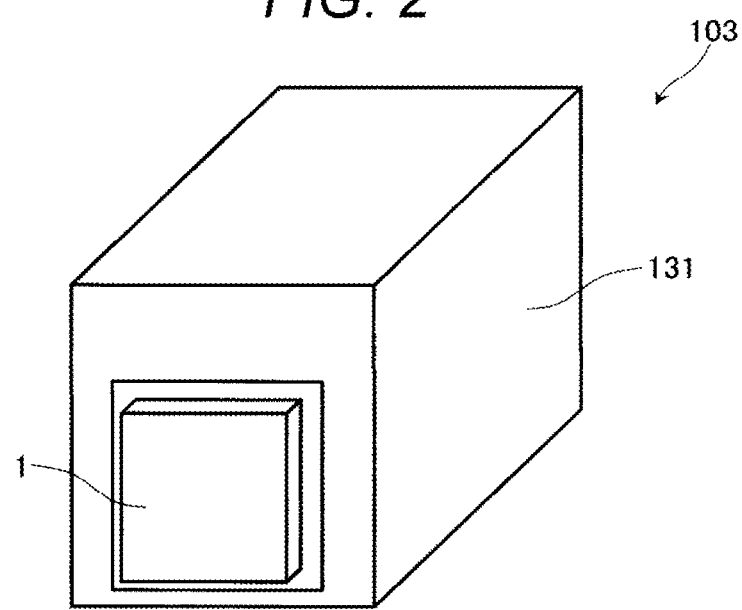
FIG. 2 is a schematic perspective view illustrating a transmission to which the electronic device according to the first embodiment of the present invention is attached.
Figure 3:
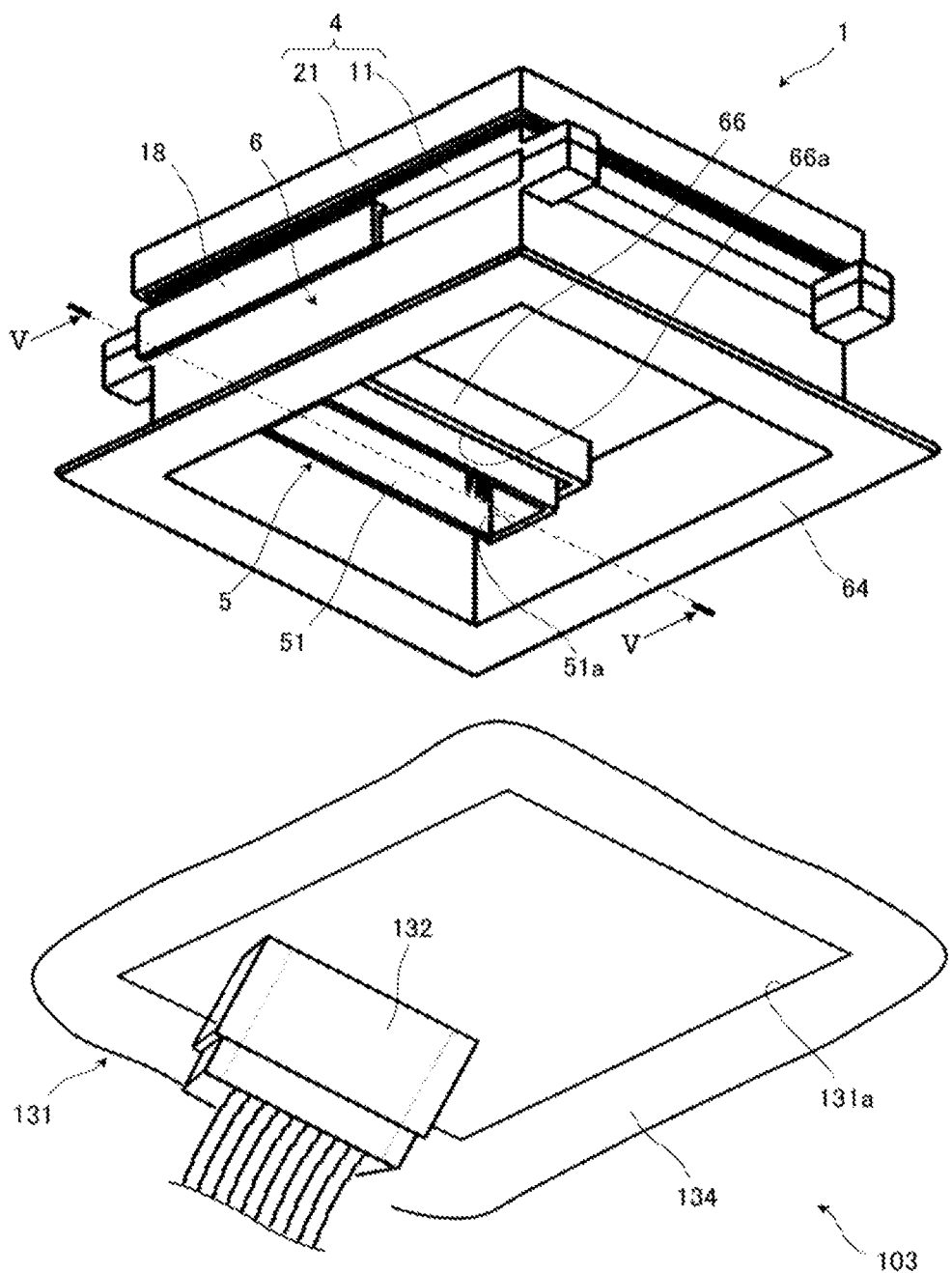
FIG. 3 is a perspective view illustrating the electronic device according to the first embodiment of the present invention together with a connector on a transmission side.

[First Embodiment] First, a configuration of a vehicle including a transmission control device as an electronic device according to a first embodiment of the present invention will be described with reference to FIGS. 1 to 3. FIG. 1 is a block diagram illustrating a configuration of a vehicle including an electronic device according to a first embodiment of the present invention. FIG. 2 is a schematic perspective view illustrating a transmission to which the electronic device according to the first embodiment of the present invention is attached. FIG. 3 is a perspective view illustrating the electronic device according to the first embodiment of the present invention together with a connector on a transmission side. In FIG. 1, a broken line indicates a control signal.

In FIG. 1, a vehicle 100 is, for example, a hybrid electric vehicle, and includes two power systems of a system using an engine 101 which is an internal combustion engine as a power source and a system using a motor generator 102 as a power source. Rotational driving force of the engine 101 and the motor generator 102 is shifted by the transmission 103 and is transmitted to left and right front wheels 105 via a differential gear 104. The motor generator 102 is electrically connected to a battery 107 via a power conversion device 106. The power conversion device 106 converts a DC power of the battery 107 into a three-phase AC power and supplies the three-phase AC power to the motor generator 102, and converts a three-phase AC power generated by the motor generator 102 into a DC power and supplies the DC power to the battery 107. Although the configuration in which the rotational driving force of the engine 101 and the motor generator 102 is transmitted to the front wheels 105 is illustrated, a configuration in which the rotational driving force is transmitted to left and right rear wheels 108 can also be used.

An operation of the engine 101 is controlled by an engine control device 110 based on a depression amount of an accelerator pedal (not illustrated). An operation of the transmission 103 is controlled by a transmission control device (hereinafter, referred to as a TCU) 1 based on a shift position of a shift lever (not illustrated). An operation of the battery 107 is controlled by a battery control device 112.

In FIG. 2, the transmission 103 includes a mechanism unit (not illustrated) that shifts and transmits the rotational driving force of the engine 101 or the motor generator 102 (see FIG. 1), and a transmission case 131 that houses the mechanism unit. Lubricating oil for lubricating the mechanism unit is stored in the transmission case 131. The TCU 1 is attached to the transmission case 131. The transmission 103 and the TCU 1 are disposed in an engine room (not illustrated).

As illustrated in FIG. 3, the transmission 103 is electrically connected to the TCU 1 via a transmission connector 132. An opening portion 131a for electrical connection with the TCU 1 is provided in the transmission case 131. The TCU 1 is detachably attached to a main body 134 of the transmission case 131 so as to close the opening portion 131a of the transmission case 131.

Figure 4:
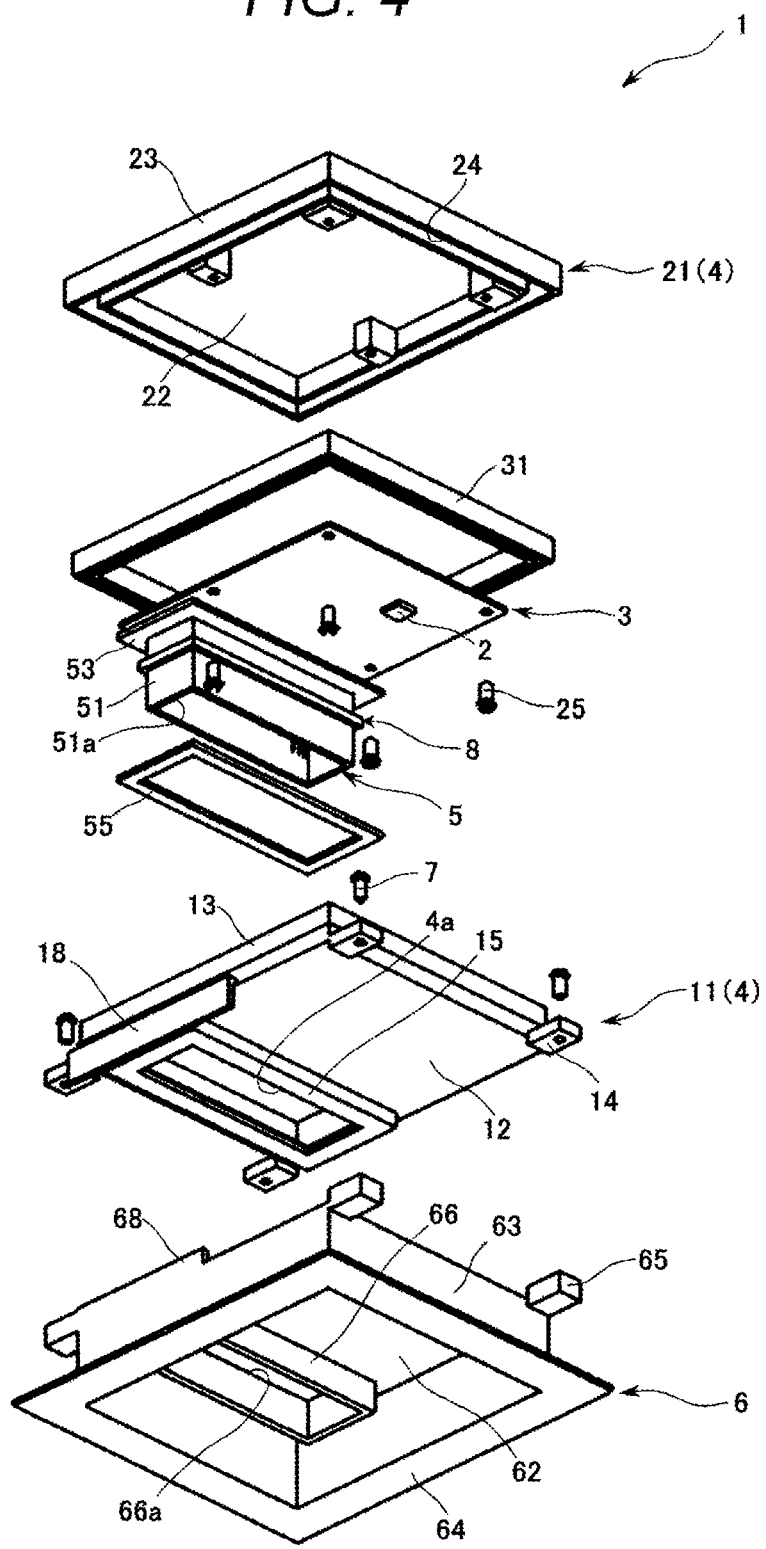
FIG. 4 is an exploded perspective view illustrating the electronic device according to the first embodiment of the present invention illustrated in FIG. 3.
Figure 5:
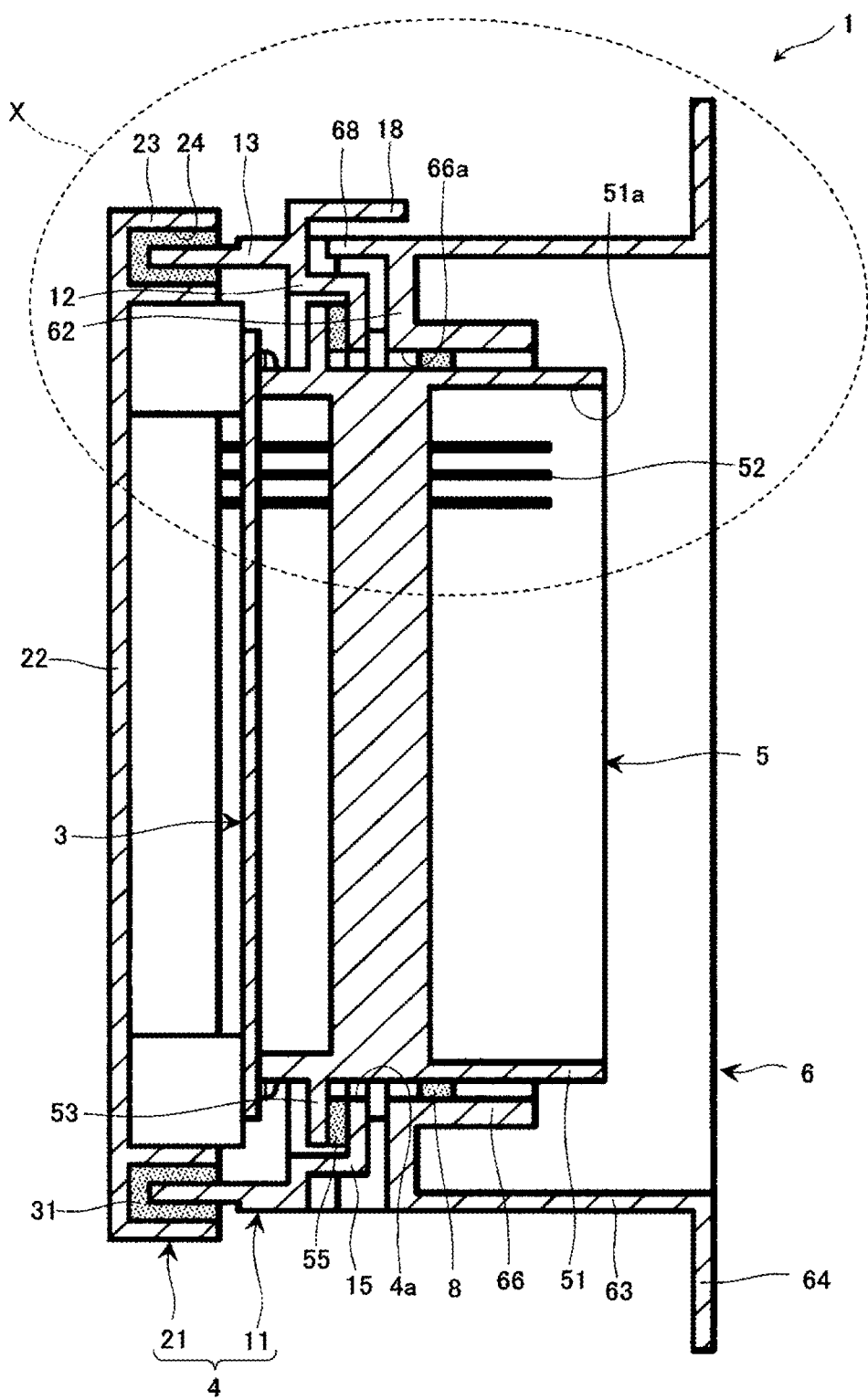
FIG. 5 is a cross-sectional view of the electronic device according to the first embodiment of the present invention illustrated in FIG. 3 as viewed from a direction of an arrow V-V.
Figure 6:
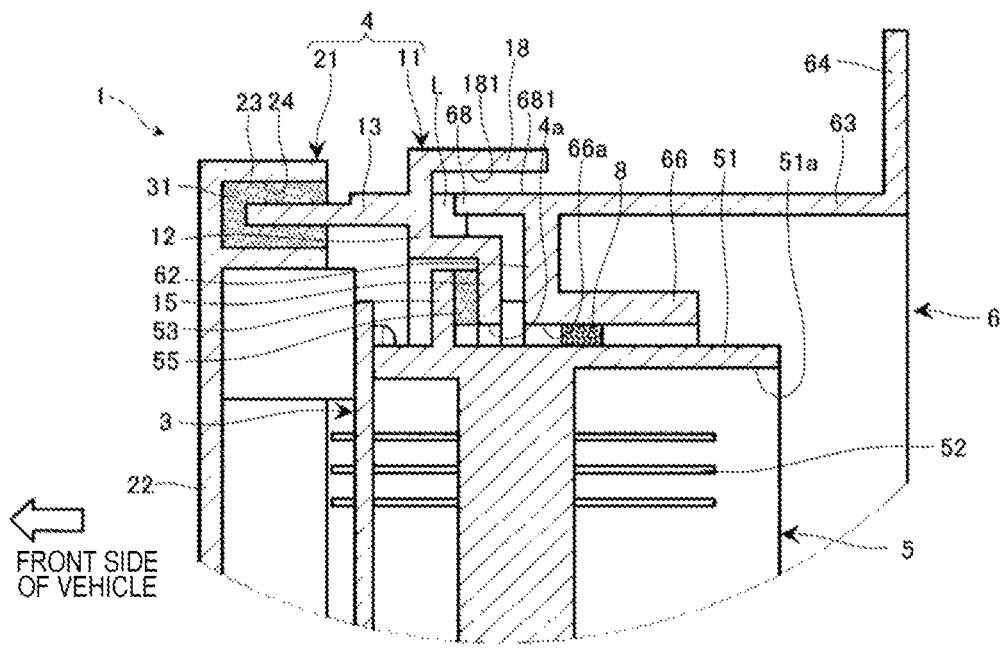
FIG. 6 is an enlarged cross-sectional view illustrating a structure of barrier portions and peripheral portions thereof in the electronic device according to the first embodiment of the present invention indicated by a reference sign X of FIG. 5.

Next, a configuration and a structure of the TCU as the electronic device according to the first embodiment of the present invention will be described with reference to FIGS. 4 to 6. FIG. 4 is an exploded perspective view of the electronic device according to the first embodiment of the present invention illustrated in FIG. 3. FIG. 5 is a cross-sectional view of the electronic device according to the first embodiment of the present invention illustrated in FIG. 3 as viewed from a direction of an arrow V-V. FIG. 6 is an enlarged cross-sectional view illustrating a structure of barrier portions and peripheral portions thereof in the electronic device according to the first embodiment of the present invention indicated by a reference sign X in FIG. 5.

In FIGS. 4 and 5, the TCU 1 includes a circuit board 3 on which electronic components 2 are mounted, a housing 4 that houses the circuit board 3, and a connector 5 mounted on the circuit board 3. A first opening portion 4a is formed in the housing 4, and the connector 5 is housed in the housing 4 such that a part thereof is exposed to the outside of the housing 4 through the first opening portion 4a of the housing 4. The connector 5 electrically connects an electric circuit of the circuit board 3 of the TCU 1 and an electric circuit of the transmission 103, and is fitted to the transmission connector 132 of the transmission 103 (see FIG. 3).

The circuit board 3 has, for example, a multilayer structure in which metal wiring layers are stacked by using resin as a base material.

The electronic components 2 are mounted on both surfaces of the circuit board 3 and are connected to the wiring layers, and the electronic components 2 and the wiring layers constitute the electric circuit.

The housing 4 includes a first case member 11 in which the first opening portion 4a is formed, and a second case member 21 that forms an internal space for housing a part of the circuit board 3 and the connector 5 together with the first case member 11.

The first case member 11 includes a first bottom portion that covers one surface (lower surface in FIG. 4, right surface in FIG. 5) of the circuit board 3, a cylindrical first peripheral wall portion 13 that is erected on a peripheral edge portion of the first bottom portion 12, and attachment portions 14 for attachment to a cover member 6 to be described later. A frame-shaped portion 15 forming the first opening portion 4a so as to protrude from the first bottom portion 12 to the outside of the housing 4 is provided in the first bottom portion 12. The first case member 11 is made of, for example, resin such as polybutylene terephthalate (PBT), polyphenylene sulfide (PPS), or nylon (PA).

The second case member 21 includes a second bottom portion 22 that covers the other side surface (top surface in FIG. 4, left surface in FIG. 5) of the circuit board 3, and an annular second peripheral wall portion 23 erected on a peripheral edge portion of the second bottom portion 22. An annular groove portion 24 to be fitted to a distal end portion of the first peripheral wall portion 13 of the first case member 11 is formed on an end surface of the second peripheral wall portion 23 of the second case member 21. For example, the circuit board 3 is attached to the second case member 21 by using first screws 25. The second case member 21 can be made of, for example, metal or resin.

In the first case member 11 and the second case member 21, the portions of the first peripheral wall portion 13 of the first case member 11 and the second peripheral wall portion 23 of the second case member 21 are joined by a first bonding member 31 filled in the annular groove portion 24 of the second case member 21. The first bonding member 31 is interposed between the first case member 11 and the second case member 21, and functions as a seal member that prevents intrusion of a liquid such as salt water into the housing 4 to liquid-tightly seal the housing 4.

The connector 5 includes, for example, a connector housing having an opening portion 51a to be fitted with the transmission connector 132 (see FIG. 3) as an external connector, and a plurality of connector terminals 52 held by the connector housing 51. The connector housing 51 has an annular flange portion 53 protruding from an outer peripheral surface, and is disposed such that the flange portion 53 is positioned inside the housing 4, for example. The connector housing 51 is made of, for example, resin such as PBT, PPS, or PA. The connector terminals 52 are electrically connected to the wiring layers of the circuit board 3.

In the connector 5 and the first case member 11 of the housing 4, an annular flange surface of the flange portion 53 of the connector housing 51 and an annular inner surface of the frame-shaped portion 15 of the first case member 11 (an inner surface around an edge portion of the first opening portion 4a) facing the flange surface are joined by a second bonding member 55. The second bonding member 55 is interposed between the connector 5 and the first case member 11 of the housing 4, and functions as a seal member that prevents intrusion of a liquid such as salt water from the first opening portion 4a of the housing 4 to liquid-tightly seal the housing 4.

The TCU 1 further includes the cover member 6 that forms a part of the transmission case 131 (see FIGS. 2 and 3) and holds the housing 4. The cover member 6 includes a third bottom portion 62 facing the first bottom portion 12 of the first case member 11, a third peripheral wall portion 63 erected from a peripheral edge portion of the third bottom portion 62, and an annular flange portion 64 protruding outward from a distal end portion of the third peripheral wall portion 63. The cover member 6 closes the opening portion 131a of the transmission case 131, and is detachably attached to the main body 134 of the transmission case 131 via the flange portion 64 (see FIG. 3). The cover member 6 is made of, for example, ADC12.

The cover member 6 further includes a plurality of attachment portions 65 for attaching the first case member 11. The cover member 6 and the first case member 11 are fixed by joining the attachment portions 14 and 65 of the cover member and the first case member to each other by second screws 7. The cover member 6 holds the housing 4 by being fixed to the case main body 134 of the transmission case 131.

A cylindrical portion 66 forming the second opening portion 66a so as to extend inward is provided in the third bottom portion 62 of the cover member 6. A portion of the connector 5 exposed to the outside of the housing 4 is fitted to the second opening portion 66a of the cylindrical portion 66. A seal member 8 is disposed in a gap between the outer peripheral surface of the connector housing 51 of the connector 5 and an inner peripheral surface of the cylindrical portion 66 of the cover member 6. The seal member 8 is interposed between the connector 5 and the cover member 6, and prevents intrusion of a liquid such as salt water into the transmission case 131 from the second opening portion 66a of the cover member 6 and prevents leakage of a liquid such as lubricating oil to the outside of the transmission case 131 to liquid-tightly seal the transmission case 131. The seal member 8 is, for example, a rubber packing, and is liquid-tightly sealed by being crushed by pressing due to sandwiching between the connector housing 51 of the connector 5 and the cylindrical portion 66 of the cover member 6.

Incidentally, parts for a vehicle are necessary to have high salt damage resistance. Since the TCU 1 is mounted in the engine room or the like, salt damage caused by a snow melting agent or the like becomes particularly severe. When salt water intrudes into the periphery of the seal member 8 interposed between the connector 5 and the cover member 6 of the TCU 1, a portion of the cover member 6 to which the salt water adheres corrodes, and thus, there is a concern that sealing performance of the seal member 8 deteriorates.

Thus, the TCU 1 in the present embodiment has a feature portion for preventing intrusion of salt water into the periphery of the seal member 8. Specifically, as illustrated in FIGS. 5 and 6, the first case member 11 of the housing 4 further includes a first barrier portion 18 that extends toward the cover member 6 so as to cover a portion of the connector 5 exposed between the frame-shaped portion 15 of the first case member 11 and the third bottom portion 62 of the cover member 6 at a distance. The cover member 6 has a second barrier portion 68 that extends toward the housing 4 so as to cover a portion of the connector 5 exposed between the frame-shaped portion 15 of the first case member 11 and the third bottom portion 62 of the cover member 6 at a distance.

The first barrier portion 18 of the first case member 11 and the second barrier portion 68 of the cover member 6 are disposed, for example, such that wall surfaces 181 and 681 face each other, and form a bent gap L (labyrinth-shaped gap) between the first case member 11 of the housing 4 and the cover member 6. That is, the first barrier portion 18 and the second barrier portion 68 are disposed so as to overlap each other as viewed from the outer peripheral surface side of the connector housing 51 of the connector 5. The first barrier portions 18 and the second barrier portions 68 are formed so as to cover at least a part of the connector housing 51 of the connector 5 in a circumferential direction. The second barrier portion 68 of the cover member 6 is disposed, for example, at a position closer to the connector 5 than the first barrier portion 18 of the first case member 11. The first barrier portion 18 is, for example, substantially parallel to an axial direction of the connector 5 (an opening direction of the opening portion 51a fitted to the transmission connector 132). Similarly, the second barrier portion 68 is, for example, substantially parallel to the axial direction of the connector 5. That is, the first barrier portion 18 and the second barrier portion 68 extend so as to be substantially parallel to each other. When the TCU 1 is attached to the transmission 103 of the vehicle 100, the TCU is preferably disposed such that the housing 4 is positioned closer to a front side of the vehicle 100 with respect to the cover member 6.

The TCU 1 as the electronic device according to the first embodiment of the present invention described above includes the circuit board 3 on which the electronic components 2 are mounted, the housing 4 that has the first opening portion 4a and houses the circuit board 3, the connector 5 that is mounted on the circuit board 3 and is exposed to the outside of the housing 4 via the first opening portion 4a of the housing 4, the cover member 6 that constitutes a part of the transmission case 131 (case) of the transmission 103 (external device), holds the housing 4, and has the second opening portion 66a to which the connector 5 is fitted, and the seal member 8 that is interposed between the connector 5 and the cover member 6 and liquid-tightly seals the transmission case 131 (case) of the transmission 103 (external device). The housing 4 includes the first barrier portion 18 that extends toward the cover member 6 so as to cover a part of the connector 5 at a distance, and the cover member 6 includes the second barrier portion 68 that extends toward the housing 4 so as to cover a part of the connector 5 at a distance.

Accordingly, even though a liquid such as salt water scatters during traveling of the vehicle 100, the first barrier portion 18 and the second barrier portion 68 covering a part of the connector 5 serve as barriers for the liquid toward the seal member 8 interposed between the connector 5 and the cover member 6 and the periphery thereof. Therefore, since the intrusion of the liquid into the seal member 8 and the periphery thereof is suppressed, salt damage resistance of the TCU 1 and the transmission 103 holding the TCU 1 can be enhanced.

The first barrier portion 18 of the housing 4 and the second barrier portion 68 of the cover member 6 in the TCU 1 according to the present embodiment are disposed such that the wall surfaces 181 and 681 face each other, and form the bent gap between the housing 4 and the cover member 6. With this configuration, since a path of the liquid toward the seal member 8 and the peripheral portion thereof becomes complicated, the intrusion of the liquid into the seal member 8 and the peripheral portion thereof is further suppressed. As a result, the salt damage resistance of the TCU 1 and the transmission 103 holding the TCU 1 can be further enhanced.

In the TCU 1 according to the present embodiment, the second barrier portion 68 of the cover member 6 is disposed at a position closer to the connector 5 than the first barrier portion 18 of the housing 4. In this configuration, when the TCU 1 is attached to the transmission 103 such that the housing 4 is disposed closer to the front side of the vehicle 100 with respect to the cover member 6, it is possible to prevent an opening portion of a path formed between the first barrier portion 18 of the housing 4 and the second barrier portion 68 of the cover member 6 from facing the front side of the vehicle 100.

Accordingly, even when the liquid such as salt water scatters during traveling of the vehicle 100, it is possible to suppress the intrusion of the liquid into the path formed between the first barrier portion 18 and the second barrier portion. As a result, the salt damage resistance of the TCU 1 and the transmission 103 holding the TCU 1 can be further enhanced.

When the TCU 1 according to the present embodiment is attached to the vehicle 100, the housing 4 is disposed closer to the front side of the vehicle 100 with respect to the cover member 6. In this case, it is possible to prevent the opening portion of the path formed between the first barrier portion 18 of the housing 4 and the second barrier portion 68 of the cover member 6 from facing the front side of the vehicle 100. Accordingly, even when the liquid such as salt water scatters during traveling of the vehicle 100, it is possible to suppress the intrusion of the liquid into the path formed between the first barrier portion 18 and the second barrier portion. As a result, the salt damage resistance of the TCU 1 and the transmission 103 holding the TCU 1 can be further enhanced.

Figure 7:
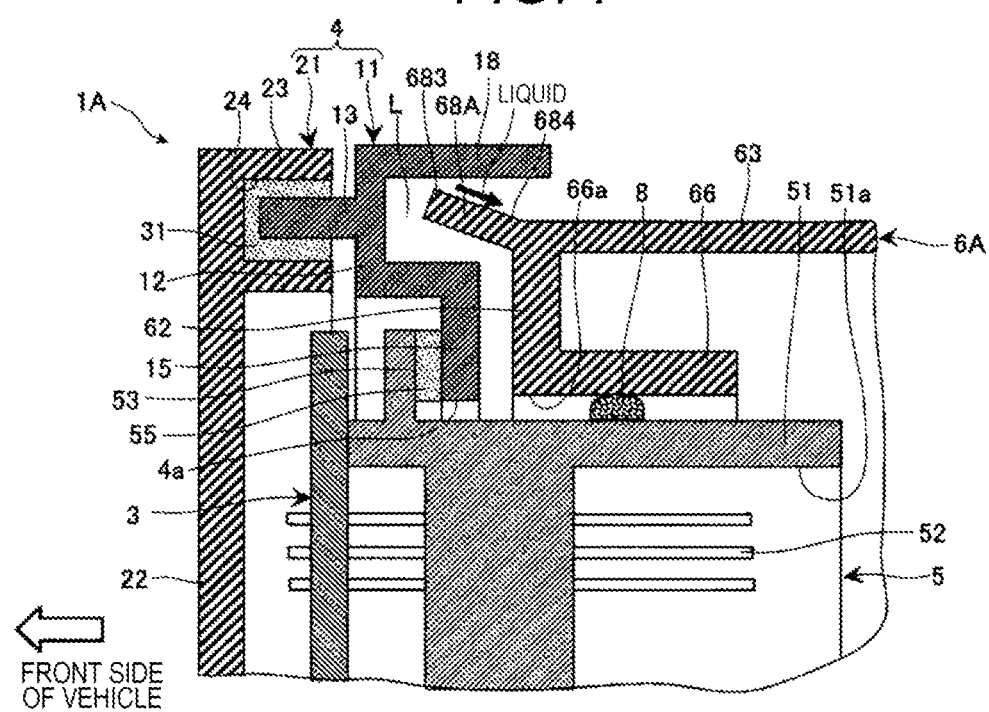
FIG. 7 is an enlarged cross-sectional view illustrating a structure of barrier portions and peripheral portions thereof in an electronic device according to a first modification example of the first embodiment of the present invention.

[Modification Examples of First Embodiment] Next, electronic devices according to first to fourth modification examples of the first embodiment of the present invention will be described. First, a configuration and operational effects of the electronic device according to the first modification example of the first embodiment of the present invention will be described with reference to FIG. 7. FIG. 7 is an enlarged cross-sectional view illustrating a structure of barrier portions and peripheral portions thereof in the electronic device according to the first modification example of the first embodiment of the present invention. In FIG. 7, a thick arrow indicates a flowing down direction of the liquid. In FIG. 7, portions denoted by reference signs similar to the reference signs illustrated in FIGS. 1 to 6 are similar portions, and thus, a detailed description thereof will be omitted.

The electronic device (TCU TA) according to the first modification example of the first embodiment of the present invention illustrated in FIG. 7 is different from the electronic device (TCU 1) according to the first embodiment in that a structure of a second barrier portion 68A of a cover member 6A is different. A structure of each member other than the cover member 6A is similar to that of the first embodiment. Specifically, the second barrier portion 68A of the cover member 6A is formed such that a distal end portion 683 is positioned closer to the first barrier portion 18 of the first case member 11 than a root portion 684. In other words, the second barrier portion 68A is formed such that the root portion 684 is positioned closer to the connector 5 than the distal end portion 683. More specifically, the second barrier portion 68A is inclined so as to be positioned gradually closer to the first barrier portion 18 from the root portion 684 toward the distal end portion 683. In other words, the second barrier portion 68A is inclined so as to be positioned gradually closer to the connector 5 from the distal end portion 683 toward the root portion 684.

In the first modification example of the first embodiment of the present invention, the second barrier portion 68A of the cover member 6A is formed such that the distal end portion 683 is positioned closer to the first barrier portion 18 of the first case member 11 than the root portion 684. With this configuration, a gap formed between the distal end portion 683 of the second barrier portion 68A of the cover member 6A and the first barrier portion 18 of the first case member 11 can be set to be smaller than that in the configuration of the first embodiment. Accordingly, the intrusion of the liquid into the path (gap) L formed between the first barrier portion 18 and the second barrier portion 68A is further suppressed, and the salt damage resistance of the TCU 1A and the transmission 103 holding the TCU 1A can be further enhanced.

In the first modification example of the first embodiment of the present invention, the second barrier portion 68A is inclined so as to be positioned gradually closer to the connector 5 from the distal end portion 683 toward the root portion 684. In this configuration, when the TCU 1 is attached to the vehicle 100 such that the second barrier portion 68A is disposed closer to a top than the connector 5, even though the liquid such as salt water adheres to an upper surface of the second barrier portion 68A (wall surface facing the first barrier portion 18), the liquid flows down due to the inclination of the second barrier portion 68A and is easily discharged from the path formed between the first barrier portion 18 and the second barrier portion 68A (see a thick arrow). Accordingly, the salt damage resistance of the TCU 1A and the transmission 103 holding the TCU 1A can be further enhanced.

Figure 8:
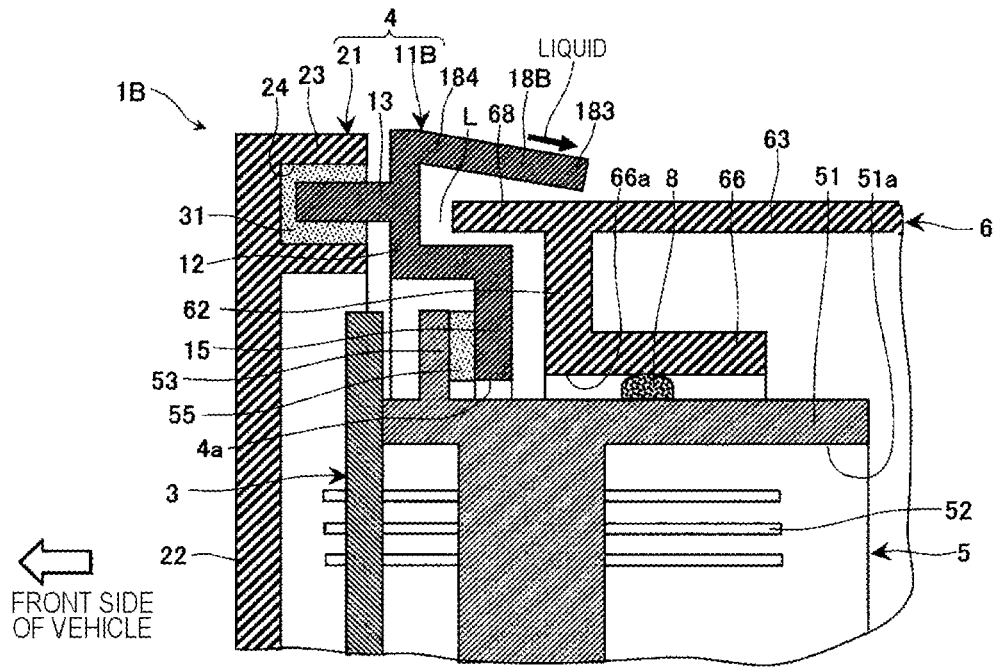
FIG. 8 is an enlarged cross-sectional view illustrating a structure of barrier portions and peripheral portions thereof in an electronic device according to a second modification example of the first embodiment of the present invention.

Next, a configuration and operational effects of an electronic device according to a second modification example of the first embodiment of the present invention will be described with reference to FIG. 8. FIG. 8 is an enlarged cross-sectional view illustrating a structure of barrier portions and peripheral portions thereof in the electronic device according to the second modification example of the first embodiment of the present invention. In FIG. 8, a thick arrow indicates a flowing down direction of the liquid. In FIG. 8, portions denoted by reference signs similar to the reference signs illustrated in FIGS. 1 to 7 are similar portions, and thus, a detailed description thereof will be omitted.

An electronic device (TCU 1B) according to the second modification example of the first embodiment of the present invention illustrated in FIG. 8 is different from the electronic device (TCU 1) according to the first embodiment in that a structure of a first barrier portion 18B of a first case member 11B is different. A structure of each member other than the first case member 11B is similar to that of the first embodiment. Specifically, the first barrier portion 18B of the first case member 11B is formed such that a distal end portion 183 is positioned closer to the second barrier portion 68 of the cover member 6 than a root portion 184. In other words, the first barrier portion 18B is formed such that the distal end portion 183 is positioned closer to the connector 5 than the root portion 184. More specifically, the first barrier portion 18B is inclined so as to be positioned gradually closer to the second barrier portion 68 from the root portion 184 toward the distal end portion 183. In other words, the first barrier portion 18B is inclined so as to be positioned gradually closer to the connector 5 from the root portion 184 toward the distal end portion 183.

In the second modification example of the first embodiment of the present invention, the first barrier portion 18B of the first case member 11B is formed such that the distal end portion 183 is positioned closer to the second barrier portion 68 of the cover member 6 than the root portion 184. With this configuration, a gap formed between the distal end portion 183 of the first barrier portion 18B of the first case member 11B and the second barrier portion 68 of the cover member 6 can be set to be smaller than that in the configuration of the first embodiment. Accordingly, the intrusion of the liquid into the path (gap) L formed between the first barrier portion 18B and the second barrier portion 68 is further suppressed, and the salt damage resistance of the TCU 1B and the transmission 103 holding the TCU 1B can be further enhanced.

In the second modification example of the first embodiment of the present invention, the first barrier portion 18B is inclined so as to be positioned gradually closer to the connector 5 from the root portion 184 toward the distal end portion 183. In this configuration, when the TCU 1B is attached to the vehicle 100 such that the first barrier portion 18B is disposed closer to the top than the connector 5, even though the liquid such as salt water adheres to an upper surface of the first barrier portion 18B, the liquid easily flows down from the first barrier portion 18B due to the inclination of the first barrier portion 18B (see a thick arrow).

Figure 9:
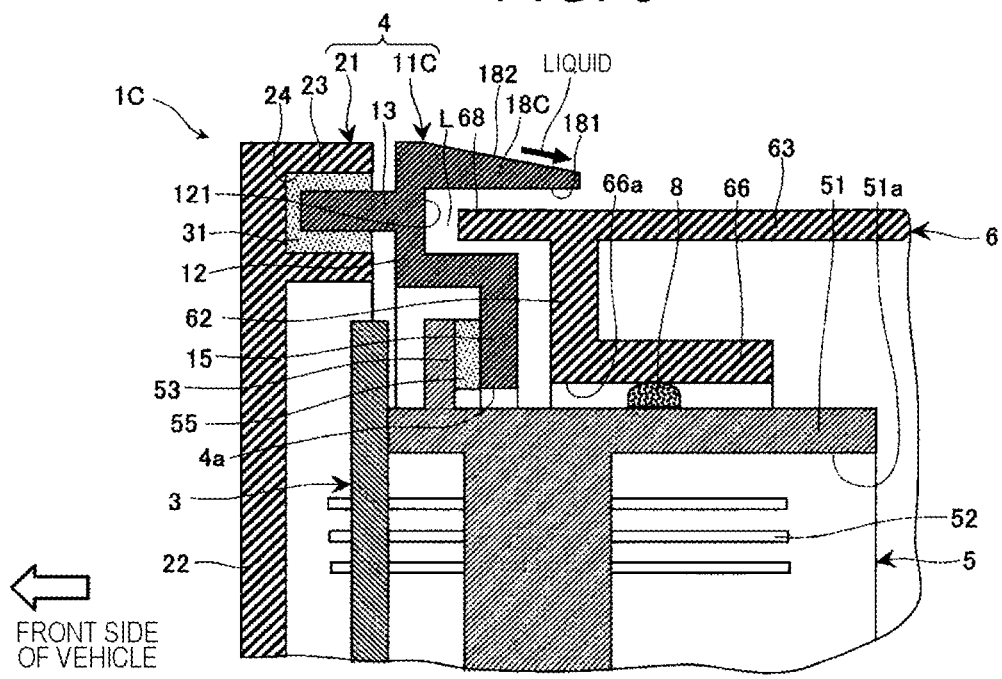
FIG. 9 is an enlarged cross-sectional view illustrating a structure of barrier portions and peripheral portions thereof in an electronic device according to a third modification example of the first embodiment of the present invention.

Next, a configuration and operational effects of an electronic device according to a third modification example of the first embodiment of the present invention will be described with reference to FIG. 9. FIG. 9 is an enlarged cross-sectional view illustrating a structure of barrier portions and peripheral portions thereof in the electronic device according to the third modification example of the first embodiment of the present invention. In FIG. 9, a thick arrow indicates a flowing down direction of the liquid. In FIG. 9, portions denoted by reference signs similar to the reference signs illustrated in FIGS. 1 to 8 are similar portions, and thus, a detailed description thereof will be omitted.

An electronic device (TCU 1C) according to the third modification example of the first embodiment of the present invention illustrated in FIG. 9 is different from the electronic device (TCU 1B) according to the second modification example of the first embodiment in that a structure of a first barrier portion 18C of a first case member 11C is different. A structure of each member other than the first case member 11C is similar to that of the second modification example of the first embodiment. Specifically, the first barrier portion 18C of the first case member 11C is formed such that the first wall surface 181 facing the second barrier portion 68 of the cover member 6 is orthogonal to an outer surface 121 of the first bottom portion 12 of the first case member 11C. In other words, the first wall surface 181 of the first barrier portion 18C is formed so as to be parallel to the axial direction of the connector 5. On the other hand, a second wall surface 182 of the first barrier portion 18C on an opposite side to the first wall surface 181 is formed as an inclined surface in which the distal end side is positioned closer to the connector 5 than the root side.

In the third modification example of the first embodiment of the present invention, the second wall surface 182 of the first barrier portion 18C on the opposite side to the first wall surface 181 facing the second barrier portion 68 of the cover member 6 is formed as the inclined surface such that the distal end side is positioned closer to the connector 5 than the root side. In this configuration, when the TCU 1C is attached to the vehicle 100 such that the first barrier portion 18C is disposed closer to the top than the connector 5, even though the liquid such as salt water adheres to an upper surface (second wall surface 182) of the first barrier portion 18C, the liquid easily flows down from the first barrier portion 18C due to the inclination of the second wall surface 182 of the first barrier portion 18C (see a thick arrow).

In the third modification example of the first embodiment of the present invention, the first wall surface 181 of the first barrier portion 18C facing the second barrier portion 68 is formed so as to be orthogonal to an outer surface of the housing 4 on the cover member 6 side (the outer surface 121 of the first bottom portion 12). With this configuration, when the first case member 11C including the first barrier portion 18C is manufactured by a mold, it is easy to manufacture the mold due to a difference in a structure of the inclined portion of the first barrier portion 18C as compared with the case of the second modification example of the first embodiment. A case where the first wall surface is "formed so as to be orthogonal" is a concept including a case where the first wall surface is "formed so as to be substantially orthogonal".

Figure 10:
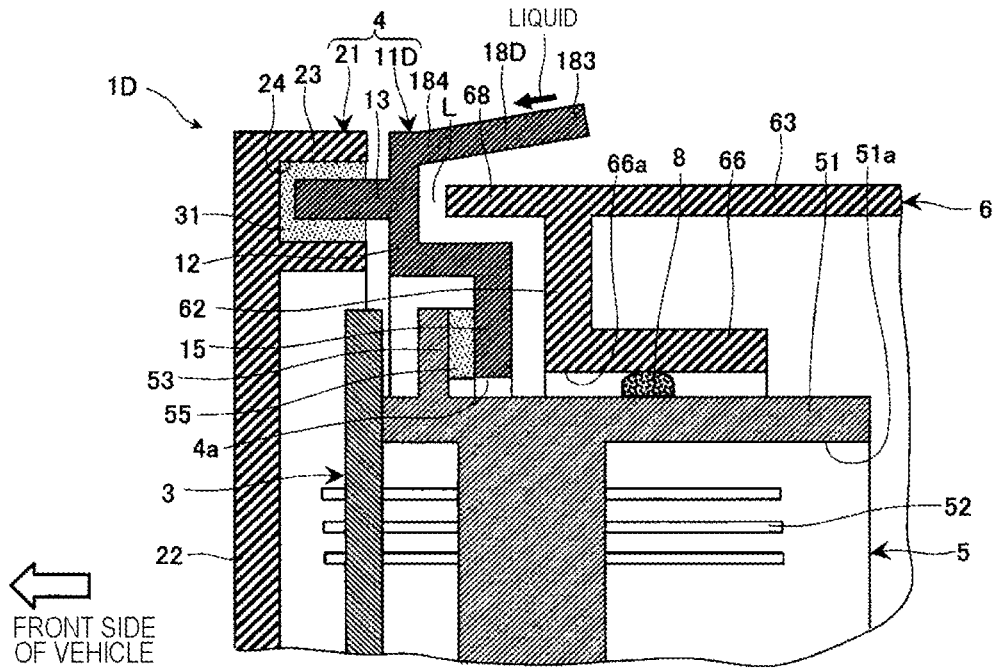
FIG. 10 is an enlarged cross-sectional view illustrating a structure of barrier portions and peripheral portions thereof in an electronic device according to a fourth modification example of the first embodiment of the present invention.

Next, a configuration and operational effects of an electronic device according to a fourth modification example of the first embodiment of the present invention will be described with reference to FIG. 10. FIG. 1 is an enlarged cross-sectional view illustrating a structure of barrier portions and peripheral portions thereof in the electronic device according to the fourth modification example of the first embodiment of the present invention. In FIG. 10, a thick arrow indicates a flowing down direction of the liquid. In FIG. 10, portions denoted by reference signs similar to the reference signs illustrated in FIGS. 1 to 9 are similar portions, and thus, a detailed description thereof will be omitted.

An electronic device (TCU 1D) according to the fourth modification example of the first embodiment of the present invention illustrated in FIG. 10 is different from the electronic device (TCU 1) according to the first embodiment in that a structure of a first barrier portion 18D of a first case member 11D is different. A structure of each member other than the first case member 11D is similar to that of the first embodiment. Specifically, the first barrier portion 18D of the first case member 11D is inclined so as to be positioned gradually closer to the second barrier portion 68 from the distal end portion 183 toward the root portion 184. In other words, the first barrier portion 18D is inclined so as to be positioned gradually closer to the connector 5 from the distal end portion 183 toward the root portion 184.

According to the configuration described above, when the TCU 1D is attached to the vehicle 100 such that the first barrier portion 18D is disposed closer to the top than the connector 5, even though the liquid such as salt water adheres to an upper surface of the first barrier portion 18D, the liquid easily flows down in a direction away from an opening portion formed between the first barrier portion 18 and the second barrier portion 68 due to the inclination of the first barrier portion 18D (see a thick arrow). Accordingly, the salt damage resistance of the TCU 1D and the transmission 103 holding the TCU 1D can be further enhanced.

Figure 11:
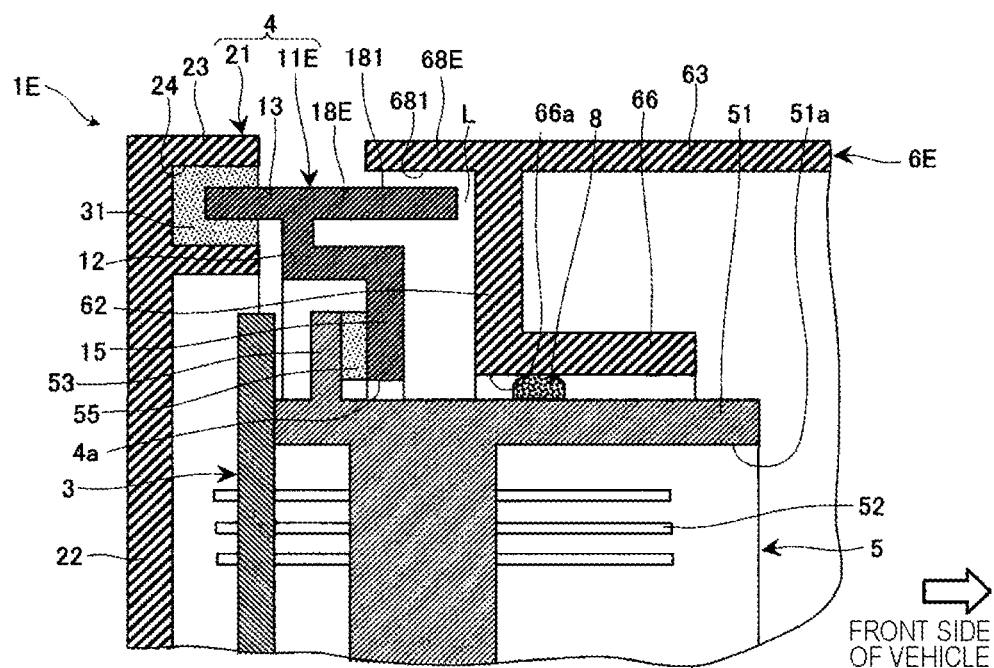
FIG. 11 is an enlarged cross-sectional view illustrating a structure of barrier portions and peripheral portions thereof in an electronic device according to a second embodiment of the present invention.

[Second Embodiment] Next, a configuration and operational effects of an electronic device according to a second embodiment of the present invention will be described with reference to FIG. 11. FIG. 11 is an enlarged cross-sectional view illustrating a structure of barrier portions and peripheral portions thereof in the electronic device according to the second embodiment of the present invention. In FIG. 11, portions denoted by reference signs similar to the reference signs illustrated in FIGS. 1 to 10 are similar portions, and thus, a detailed description thereof will be omitted.

An electronic device (TCU 1E) according to the second embodiment of the present invention illustrated in FIG. 11 is different from the electronic device (TCU 1) according to the first embodiment in that a disposition relationship between the first barrier portion 18E of the first case member 11E and a second barrier portion 68E of a cover member 6E is different. In the first embodiment, the second barrier portion 68 of the cover member 6 is disposed at a position closer to the connector 5 than the first barrier portion 18 of the first case member 11 (see FIG. 6). On the other hand, in the second embodiment, the first barrier portion 18E of the first case member 11E is disposed at a position closer to the connector 5 than the second barrier portion 68E of the cover member 6E. The first barrier portion 18E and the second barrier portion 68E are, for example, parallel to the axial direction of the connector 5. That is, the first barrier portion 18E and the second barrier portion 68E extend so as to be substantially parallel to each other. When the TCU 1E is attached to the transmission 103 of the vehicle 100, the TCU is preferably disposed such that the cover member 6E is positioned closer to the front side of the vehicle 100 with respect to the housing 4.

The TCU 1E as the electronic device according to the second embodiment of the present invention described above can obtain effects similar to those of the first embodiment.

In the TCU 1E according to the second embodiment, the first barrier portion 18E of the first case member 11E is disposed at a position closer to the connector 5 than the second barrier portion 68E of the cover member 6E. In this configuration, when the TCU 1E is attached to the transmission 103 of the vehicle 100 such that the cover member 6E is disposed closer to the front side of the vehicle 100 with respect to the housing 4, an opening portion formed by the first barrier portion 18E of the housing 4 and the second barrier portion 68E of the cover member 6E can be prevented from facing the front side of the vehicle 100. Accordingly, even when the liquid such as salt water scatters during traveling of vehicle 100, it is possible to suppress the intrusion of the liquid into a path formed between first barrier portion 18E and the second barrier portion 68E. As a result, the salt damage resistance of the TCU 1E and the transmission 103 holding the TCU 1E can be further enhanced.

When the TCU 1E according to the present embodiment is attached to the vehicle 100, the cover member 6E is disposed closer to the front side of the vehicle 100 with respect to the housing 4. In this case, it is possible to prevent the opening portion formed by the first barrier portion 18E of the housing 4 and the second barrier portion 68E of the cover member 6E from facing the front side of the vehicle 100. Accordingly, even when the liquid such as salt water scatters during traveling of vehicle 100, it is possible to suppress the intrusion of the liquid into a path formed between first barrier portion 18E and the second barrier portion 68E. As a result, the salt damage resistance of the TCU 1E and the transmission 103 holding the TCU 1E can be further enhanced.

Figure 12:
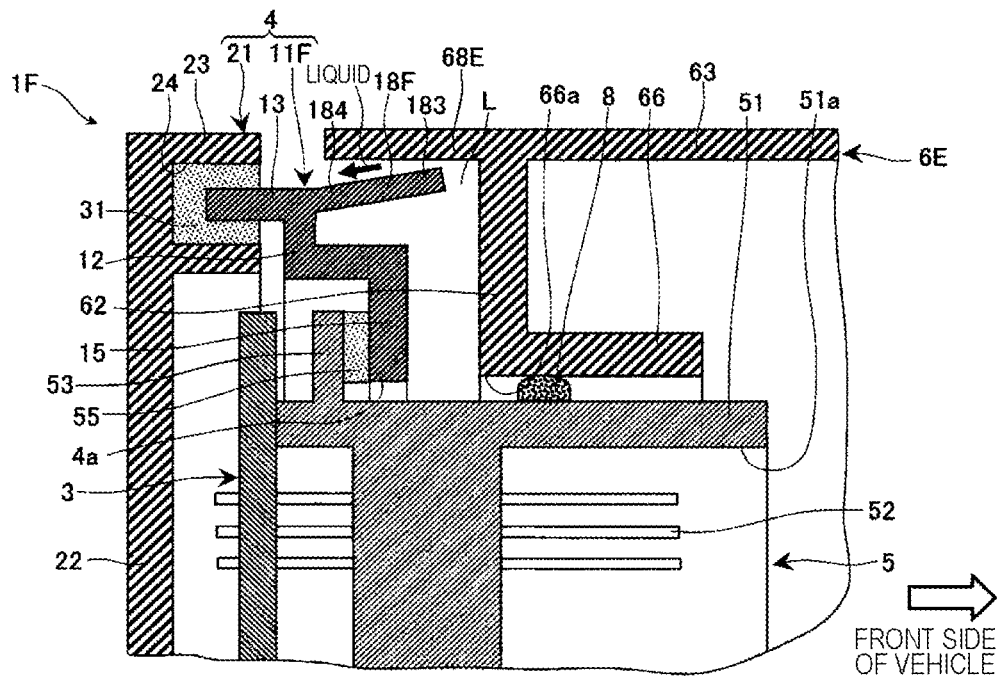
FIG. 12 is an enlarged cross-sectional view illustrating a structure of barrier portions and peripheral portions thereof in an electronic device according to a first modification example of the second embodiment of the present invention.

[Modification Examples of Second Embodiment] Next, electronic devices according to first to fourth modification examples of the second embodiment of the present invention will be described. First, a configuration and operational effects of the electronic device according to the first modification example of the second embodiment of the present invention will be described with reference to FIG. 12. FIG. 12 is an enlarged cross-sectional view illustrating a structure of barrier portions and peripheral portions thereof in the electronic device according to the first modification example of the second embodiment of the present invention.

In FIG. 12, a thick arrow indicates a flowing down direction of the liquid. In FIG. 12, portions denoted by reference signs similar to the reference signs illustrated in FIGS. 1 to 11 are similar portions, and thus, a detailed description thereof will be omitted.

An electronic device (TCU 1F) according to a first modification example of the second embodiment of the present invention illustrated in FIG. 12 is different from the electronic device (TCU 1E) according to the second embodiment in that a structure of a first barrier portion 18F of a first case member 11F is different. A structure of each member other than the first case member 11F is similar to that of the second embodiment. Specifically, the first barrier portion 18F of the first case member 11F is formed such that the distal end portion 183 is positioned closer to the second barrier portion 68E of the cover member 6E than the root portion 184. In other words, the first barrier portion 18F is formed such that the root portion 184 is positioned closer to the connector 5 than the distal end portion 183. More specifically, the first barrier portion 18F is inclined so as to be positioned gradually closer to the second barrier portion 68E from the root portion 184 toward the distal end portion 183. In other words, the first barrier portion 18F is inclined so as to be positioned gradually closer to the connector 5 from the distal end portion 183 toward the root portion 184.

In the first modification example of the second embodiment of the present invention, the first barrier portion 18F of the first case member 11F is formed such that the distal end portion 183 is positioned closer to the second barrier portion 68E of the cover member 6E than the root portion 184. With this configuration, a gap formed between the distal end portion 183 of the first barrier portion 18F of the first case member 11F and the second barrier portion 68E of the cover member 6E can be set to be smaller than that in the configuration of the second embodiment. Accordingly, the intrusion of the liquid into the path (gap) L formed between the first barrier portion 18F and the second barrier portion 68E is further suppressed, and the salt damage resistance of the TCU 1F and the transmission 103 holding the TCU 1F can be further enhanced.

In the first modification example of the second embodiment of the present invention, the first barrier portion 18F is inclined so as to be positioned gradually closer to the connector 5 from the distal end portion 183 toward the root portion 184. In this configuration, when the TCU 1F is attached to the vehicle 100 such that the first barrier portion 18F is disposed closer to the top than the connector 5, even though the liquid such as salt water adheres to an upper surface of the first barrier portion 18F (wall surface facing the second barrier portion 68E), the liquid flows down from the inclination of the first barrier portion 18F and is easily discharged from the path formed between the first barrier portion 18F and the second barrier portion 68E (see a thick arrow). Accordingly, the salt damage resistance of the TCU 1F and the transmission 103 holding the TCU 1F can be further enhanced.

Figure 13:
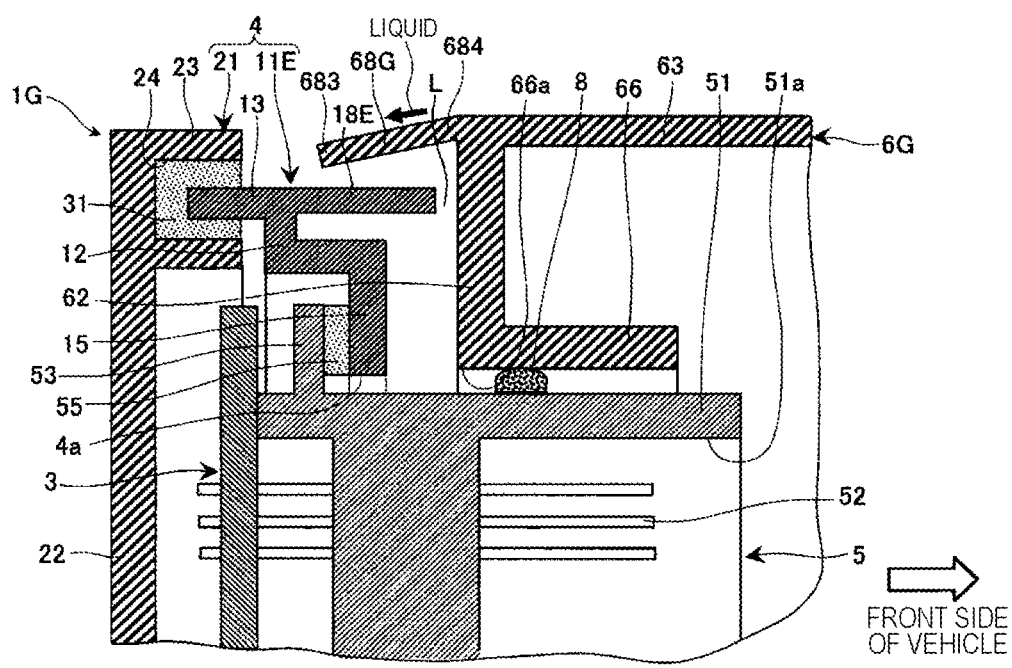
FIG. 13 is an enlarged cross-sectional view illustrating a structure of barrier portions and peripheral portions thereof in an electronic device according to a second modification example of the second embodiment of the present invention.

Next, a configuration and operational effects of an electronic device according to a second modification example of the second embodiment of the present invention will be described with reference to FIG. 13. FIG. 13 is an enlarged cross-sectional view illustrating a structure of barrier portions and peripheral portions thereof in the electronic device according to the second modification example of the second embodiment of the present invention. In FIG. 13, a thick arrow indicates a flowing down direction of the liquid. In FIG. 13, portions denoted by reference signs similar to the reference signs illustrated in FIGS. 1 to 12 are similar portions, and thus, a detailed description thereof will be omitted.

An electronic device (TCU 1G) according to the second modification example of the second embodiment of the present invention illustrated in FIG. 13 is different from the electronic device (TCU 1E) according to the second embodiment in that a structure of a second barrier portion 68G of a cover member 6G is different. A structure of each member other than the cover member 6G is similar to that of the second embodiment. Specifically, the second barrier portion 68G of the cover member 6G is formed such that the distal end portion 683 is positioned closer to the first barrier portion 18E of the first case member 11E than the root portion 684. In other words, the second barrier portion 68G is formed such that the distal end portion 683 is positioned closer to the connector 5 than the root portion 684. More specifically, the second barrier portion 68G is inclined so as to be positioned gradually closer to the first barrier portion 18E from the root portion 684 toward the distal end portion 683. In other words, the second barrier portion 68G is inclined so as to be positioned gradually closer to the connector 5 from the root portion 684 toward the distal end portion 683.

In the second modification example of the second embodiment of the present invention, the second barrier portion 68G of the cover member 6G is formed such that the distal end portion 683 is positioned closer to the first barrier portion 18E of the first case member 11E than the root portion 684. With this configuration, a gap formed between the distal end portion 683 of the second barrier portion 68G of the cover member 6G and the first barrier portion 18E of the first case member 11E can be set to be smaller than that in the configuration of the second embodiment. Accordingly, the intrusion of the liquid into the path (gap) L formed between the first barrier portion 18E and the second barrier portion 68G is further suppressed, and the salt damage resistance of the TCU 1G and the transmission 103 holding the TCU 1G can be further enhanced.

In the second modification example of the second embodiment of the present invention, the second barrier portion 68G is inclined so as to be positioned gradually closer to the connector 5 from the root portion 684 toward the distal end portion 683. In this configuration, when the TCU 1G is attached to the vehicle 100 such that the second barrier portion 68G is disposed closer to the top than the connector 5, even though the liquid such as salt water adheres to an upper surface of the second barrier portion 68G, the liquid easily flows down from the second barrier portion 68G due to the inclination of the second barrier portion 68G (see a thick arrow).

Figure 14:
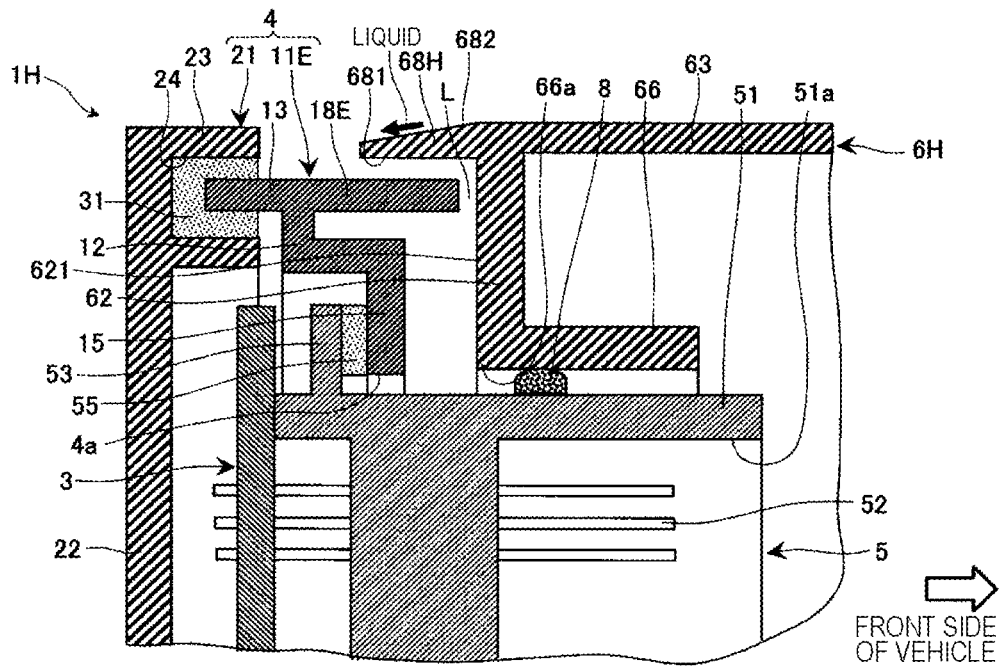
FIG. 14 is an enlarged cross-sectional view illustrating a structure of barrier portions and peripheral portions thereof in an electronic device according to a third modification example of the second embodiment of the present invention.

Next, a configuration and operational effects of an electronic device according to a third modification example of the second embodiment of the present invention will be described with reference to FIG. 14. FIG. 14 is an enlarged cross-sectional view illustrating a structure of barrier portions and peripheral portions thereof in the electronic device according to the third modification example of the second embodiment of the present invention. In FIG. 14, a thick arrow indicates a flowing down direction of the liquid. In FIG. 14, portions denoted by reference signs similar to the reference signs illustrated in FIGS. 1 to 13 are similar portions, and thus, a detailed description thereof will be omitted.

An electronic device (TCU 1H) according to the third modification example of the second embodiment of the present invention illustrated in FIG. 14 is different from the electronic device (TCU 1G) according to the second modification example of the second embodiment in that a structure of a second barrier portion 68H of a cover member 6H is different. A structure of each member other than the cover member 6H is similar to that of the second modification example of the second embodiment. Specifically, the second barrier portion 68H of the cover member 6H is formed such that the first wall surface 681 facing the first barrier portion 18E of the first case member 11E is orthogonal to the outer surface 621 of the third bottom portion 62 of the cover member 6H. In other words, the first wall surface 681 of the second barrier portion 68H is formed so as to be parallel to the axial direction of the connector 5. On the other hand, a second wall surface 682 of the second barrier portion 68H on an opposite side to the first wall surface 681 is formed as an inclined surface such that the distal end side is positioned closer to the connector 5 than the root side.

In the third modification example of the second embodiment of the present invention, the second wall surface 682 of the second barrier portion 68H on the opposite side to the first wall surface 681 facing the first barrier portion 18E of the first case member 11E is formed as the inclined surface in which the distal end side is positioned closer to the connector 5 than the root side. In this configuration, when the TCU 1H is attached to the vehicle 100 such that the second barrier portion 68H is disposed closer to the top than the connector 5, even though the liquid such as salt water adheres to an upper surface (second wall surface 682) of the second barrier portion 68H, the liquid easily flows down from the second barrier portion 68H due to the inclination of the second wall surface 682 of the second barrier portion 68H (see a thick arrow).

In the third modification example of the second embodiment of the present invention, the first wall surface 681 of the second barrier portion 68H facing the first barrier portion 18E is formed so as to be orthogonal to an outer surface of the cover member 6H on the housing 4 side (the outer surface 621 of the third bottom portion 62). With this configuration, when the cover member 6H including the second barrier portion 68H is manufactured by a mold, it is easy to manufacture the mold due to a difference in a structure of the inclined portion of the second barrier portion 68H as compared with the case of the second modification example of the second embodiment. A case where the first wall surface is "formed so as to be orthogonal" is a concept including a case where the first wall surface is "formed so as to be substantially orthogonal".

Figure 15:
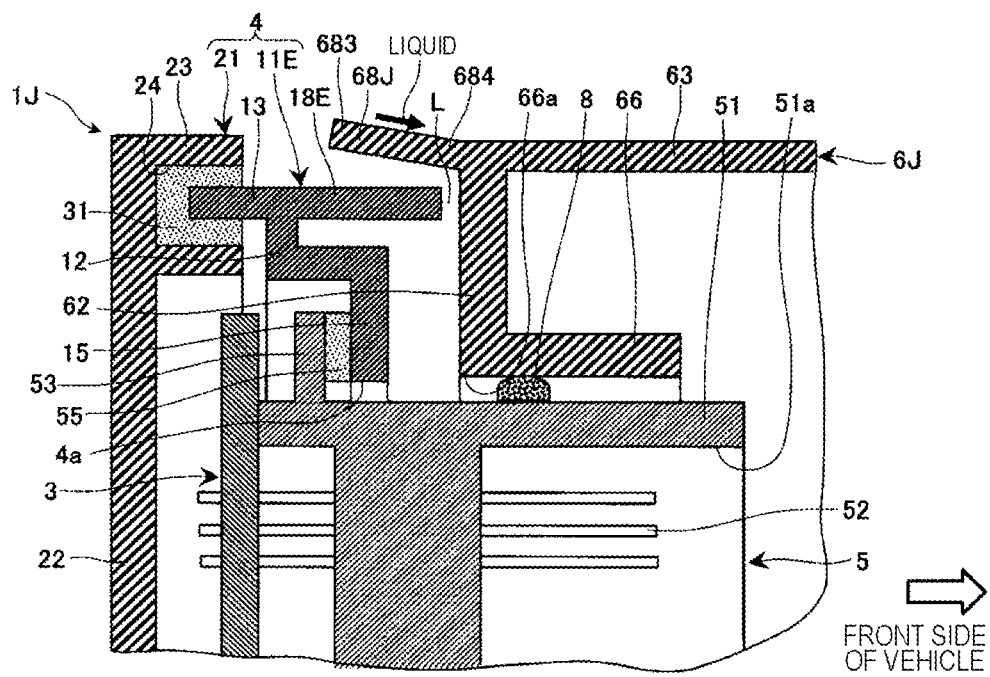
FIG. 15 is an enlarged cross-sectional view illustrating a structure of barrier portions and peripheral portions thereof in an electronic device according to a fourth modification example of the second embodiment of the present invention.

Next, a configuration and operational effects of an electronic device according to a fourth modification example of the second embodiment of the present invention will be described with reference to FIG. 15. FIG. 15 is an enlarged cross-sectional view illustrating a structure of barrier portions and peripheral portions thereof in the electronic device according to the fourth modification example of the second embodiment of the present invention. In FIG. 15, a thick arrow indicates a flowing down direction of the liquid. In FIG. 15, portions denoted by reference signs similar to the reference signs illustrated in FIGS. 1 to 14 are similar portions, and thus, a detailed description thereof will be omitted.

An electronic device (TCU 1J) according to the fourth modification example of the second embodiment of the present invention illustrated in FIG. 15 is different from the electronic device (TCU 1E) according to the second embodiment in that a structure of a second barrier portion 68J of a cover member 6J is different. A structure of each member other than the cover member 6J is similar to that of the second embodiment. Specifically, the second barrier portion 68J of the cover member 6J is inclined so as to be positioned gradually closer to the first barrier portion 18E from the distal end portion 683 toward the root portion 684. In other words, the second barrier portion 68J is inclined so as to be positioned gradually closer to the connector 5 from the distal end portion 683 toward the root portion 684.

According to the configuration described above, when the TCU 1J is attached to the vehicle 100 such that the second barrier portion 68J is disposed closer to the top than the connector 5, even though the liquid such as salt water adheres to an upper surface of the second barrier portion 68J, the liquid easily flows down in a direction away from an opening portion formed between the second barrier portion 68J and the first barrier portion 18E due to the inclination of the second barrier portion 68J (see a thick arrow). Accordingly, the salt damage resistance of the TCU 1J and the transmission 103 holding the TCU 1J can be further enhanced.

Figure 16:
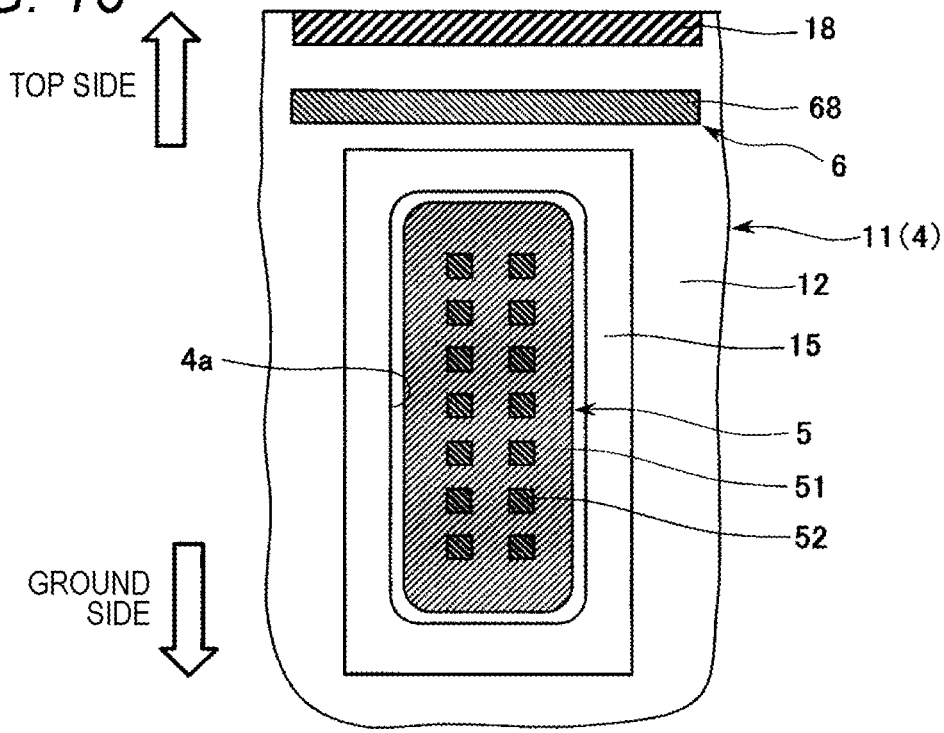
FIG. 16 is a cross-sectional view illustrating the disposition and shapes of barrier portions in an electronic device according to a third embodiment of the present invention.

[Third Embodiment] Next, a configuration and a function effect of an electronic device according to a third embodiment of the present invention will be described with reference to FIG. 16. The present embodiment defines the disposition of the first barrier portion of the first case member and the second barrier portion of the cover member when an electronic device having a structure similar to that of the first embodiment is attached to the transmission case of the vehicle, and defines cross-sectional shapes of surfaces of the first barrier portion and the second barrier portion orthogonal to the axial direction of the connector. FIG. 16 is a cross-sectional view illustrating the disposition and shapes of the barrier portions in the electronic device according to the third embodiment of the present invention. In FIG. 16, portions denoted by reference signs similar to the reference signs illustrated in FIG. 1 to are similar portions, and thus, a detailed description thereof will be omitted.

The electronic device according to the third embodiment of the present invention illustrated in FIG. 16 is attached to the transmission case 131 of the transmission 103 (see FIG. 2) of the vehicle 100 such that the first barrier portion 18 of the first case member 11 and the second barrier portion 68 of the cover member 6 are positioned closer to the top than the connector 5. The first barrier portion 18 of the first case member 11 and the second barrier portion 68 of the cover member 6 are formed such that a cross-sectional shape of a surface orthogonal to an extending direction (axial direction of the connector 5) is an elongated rectangular shape.

According to the electronic device according to the third embodiment of the present invention described above, when the electronic device is attached to the vehicle 100, since the first barrier portion 18 is disposed closer to the top than the connector 5, it is possible to suppress the intrusion of the liquid containing the snow melting agent or the like and foreign matter from the top into the peripheral portion of the seal member 8 due to winding-up or the like during traveling.

Similarly, according to the electronic device according to the third embodiment of the present invention described above, when the electronic device is attached to the vehicle 100, since the second barrier portion 68 is disposed closer to the top than the connector 5, it is possible to suppress the intrusion of the liquid containing the snow melting agent or the like and the foreign matter from the top into the peripheral portion of the seal member 8 due to winding-up during traveling.

Figure 17:
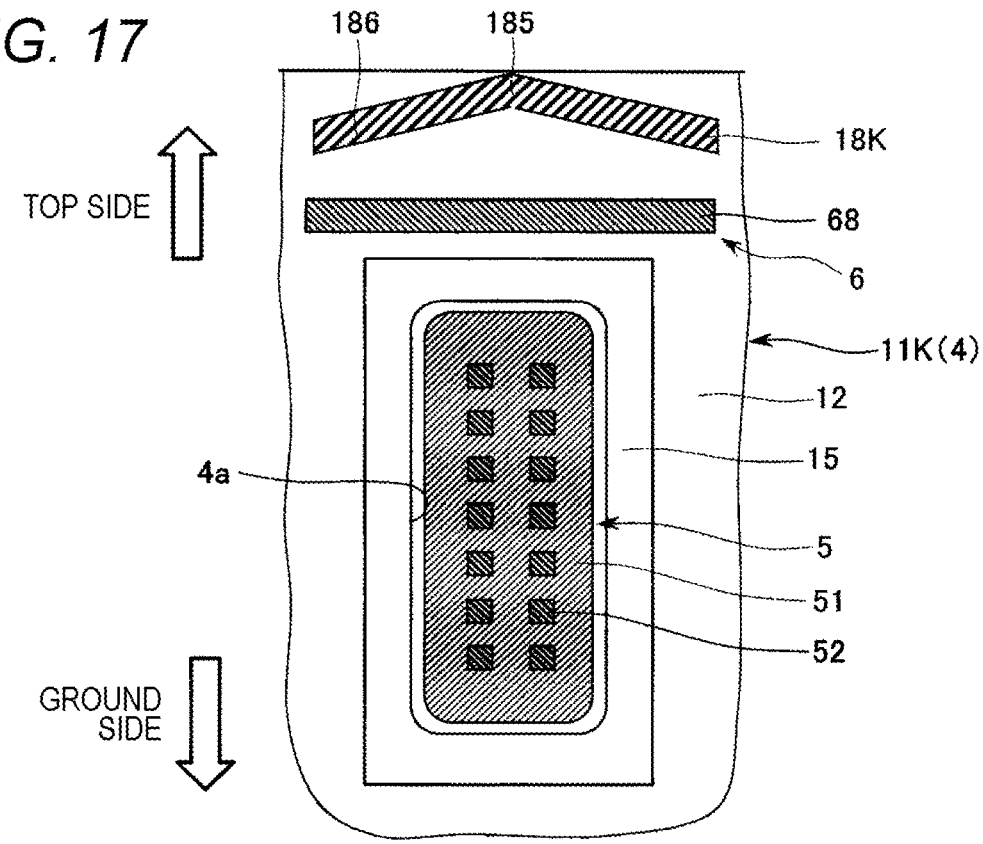
FIG. 17 is a cross-sectional view illustrating the disposition and shapes of barrier portions in an electronic device according to a first modification example of the third embodiment of the present invention.
Figure 18:
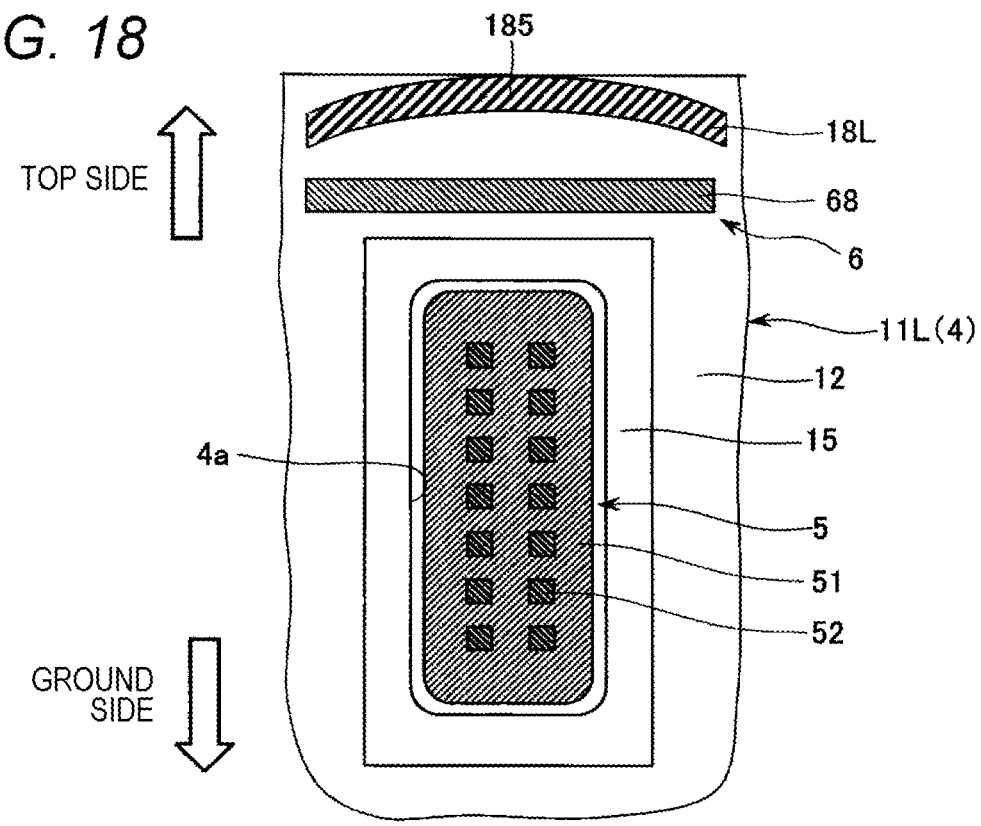
FIG. 18 is a cross-sectional view illustrating the disposition and shapes of barrier portions in an electronic device according to a second modification example of the third embodiment of the present invention.

[Modification Examples of Third Embodiment] Next, electronic devices according to first to sixth modification examples of the third embodiment of the present invention will be described. First, configurations and operational effects of electronic devices according to a first modification example and a second modification example of the third embodiment of the present invention will be described with reference to FIGS. 17 and 18. FIG. 17 is a cross-sectional view illustrating the disposition and shapes of barrier portions in the electronic device according to the first modification example of the third embodiment of the present invention. FIG. 18 is a cross-sectional view illustrating the disposition and shape of barrier portions in the electronic device according to the second modification example of the third embodiment of the present invention. In FIGS. 17 and 18, portions denoted by reference signs similar to the reference signs illustrated in FIG. 1 to 16 are similar portions, and thus, a detailed description thereof will be omitted.

The electronic device according to the first modification example of the third embodiment of the present invention illustrated in FIG. 17 and the electronic device according to the second modification example of the third embodiment illustrated in FIG. 18 are different from the electronic device according to the third embodiment in that structures of first barrier portions 18K and 18L of first case members 11K and 11L are different. A structure of each member other than the first case members 11K and 11L is similar to that of the third embodiment.

Specifically, the first barrier portion 18K of the first case member 11K in the first modification example illustrated in FIG. 17 is inclined such that a cross-sectional shape of a surface orthogonal to an extending direction (axial direction of the connector 5) is positioned so as to be positioned gradually closer to a ground from a central portion 185 toward both side portions 186 thereof.

According to the configuration of the first modification example described above, even though the liquid such as salt water adheres to an upper surface of the first barrier portion 18K due to winding-up during traveling of the vehicle, the liquid flows down due to the inclination of both sides of the first barrier portion 18K. Accordingly, the intrusion of the liquid into a path (gap) formed between the first barrier portion 18K and the second barrier portion 68 is suppressed, and the salt damage resistance of the electronic device and the transmission 103 holding the electronic device can be further enhanced.

On the other hand, in the first barrier portion 18L of the first case member 11L in the second modification example illustrated in FIG. 18, a cross-sectional shape of a surface orthogonal to an extending direction (axial direction of the connector 5) is formed in an arc shape with the central portion 185 as an uppermost portion.

According to the configuration of the second modification example described above, even though the liquid such as salt water adheres to an upper surface of the first barrier portion 18L due to winding-up during traveling of the vehicle, the liquid flows down due to the arc-shaped inclination of the first barrier portion 18L. Accordingly, the intrusion of the liquid into a path (gap) formed between the first barrier portion 18L and the second barrier portion 68 is suppressed, and the salt damage resistance of the electronic device and the transmission 103 holding the electronic device can be further enhanced.

Figure 19:
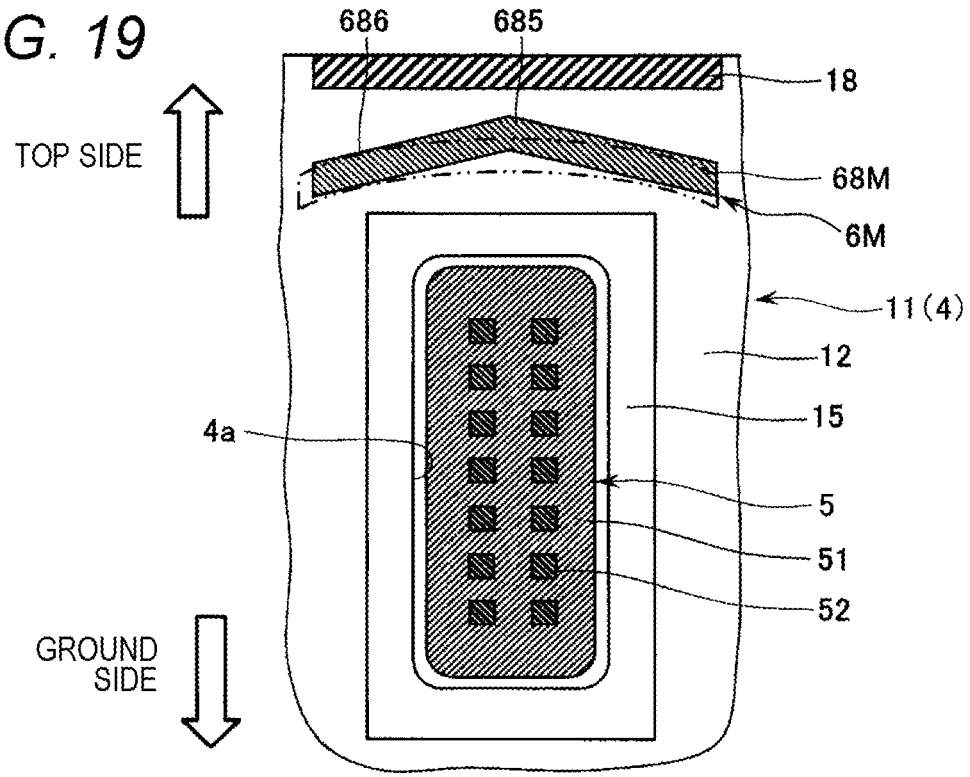
FIG. 19 is a cross-sectional view illustrating the disposition and shapes of barrier portions in an electronic device according to a third modification example of the third embodiment of the present invention.

Next, a configuration and operational effects of the electronic device according to the third modification example of the third embodiment of the present invention will be described with reference to FIG. 19. FIG. 19 is a cross-sectional view illustrating the disposition and shapes of barrier portions in the electronic device according to the third modification example of the third embodiment of the present invention. In FIG. 19, portions denoted by reference signs similar to the reference signs illustrated in FIGS. 1 to 18 are similar portions, and thus, a detailed description thereof will be omitted.

The electronic device according to the third modification example of the third embodiment of the present invention illustrated in FIG. 19 is different from the electronic device according to the third embodiment in that a structure of a second barrier portion 68M of a cover member 6M is different. A structure of each member other than the cover member 6M is similar to that of the third embodiment. Specifically, the second barrier portion 68M of the cover member 6M is inclined such that a cross-sectional shape of a surface orthogonal to the extending direction (axial direction of the connector 5) is positioned gradually closer to a ground from the central portion 685 toward both the side portions 686 thereof. According to the configuration described above, even though the liquid such as salt water adheres to an upper surface of the second barrier portion 68M due to winding-up during traveling of the vehicle, the liquid flows down due to inclination on both the sides of the second barrier portion 68. Accordingly, the dischargibility of the liquid that has intruded the path (gap) formed between the first barrier portion 18 and the second barrier portion 68M is improved, and the salt damage resistance of the electronic device and the transmission 103 holding the electronic device can be further improved.

Similarly to the first barrier portion 18L of the second modification example of the third embodiment, a cross-sectional shape of a surface orthogonal to an extending direction of the second barrier portion can be formed in an arc shape with the central portion 685 as the uppermost portion (see the second barrier portion indicated by a dashed double-dotted line in FIG. 19). Even with this configuration, it is possible to obtain effects similar to that of the first barrier portion 18L of the second modification example of the third embodiment.

Figure 20:
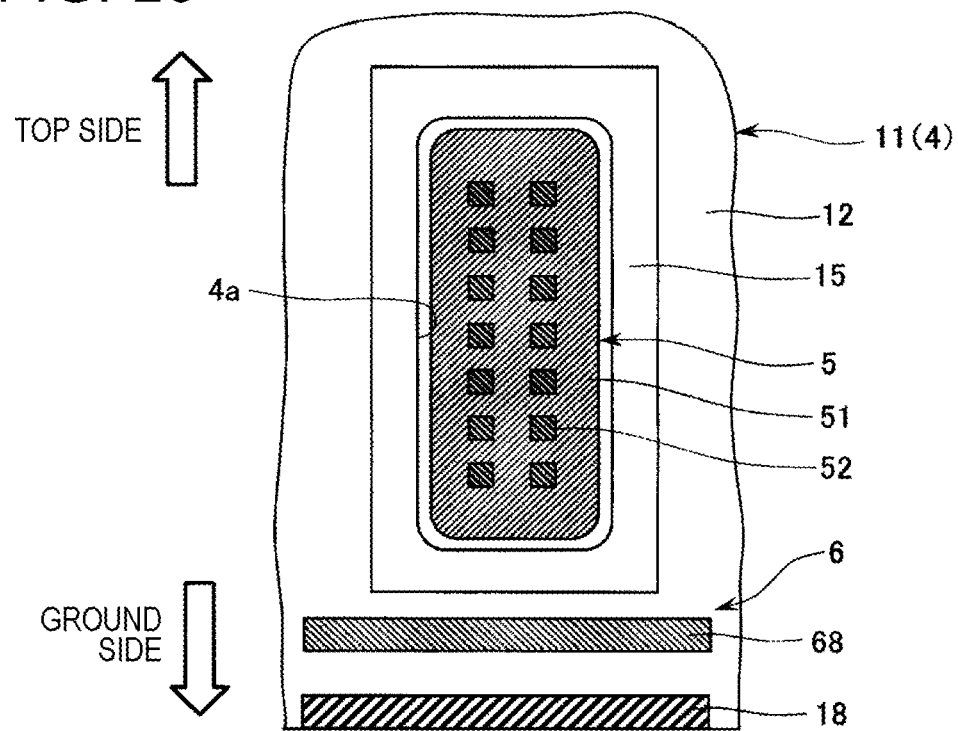
FIG. 20 is a cross-sectional view illustrating the disposition and shapes of barrier portions in an electronic device according to a fourth modification example of the third embodiment of the present invention.
Figure 21:
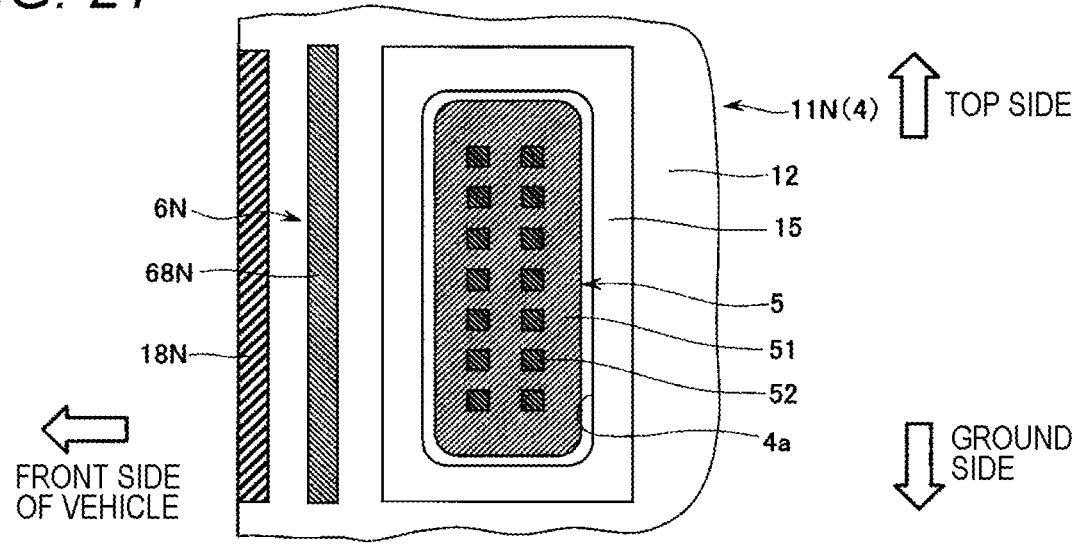
FIG. 21 is a cross-sectional view illustrating the disposition and shapes of barrier portions in an electronic device according to a fifth modification example of the third embodiment of the present invention.

Next, configurations and operational effects of electronic devices according to a fourth modification example and a fifth modification example of the third embodiment of the present invention will be described with reference to FIGS. 20 and 21. FIG. 20 is a cross-sectional view illustrating the disposition and shapes of barrier portions in the electronic device according to the fourth modification example of the third embodiment of the present invention. FIG. 21 is a cross-sectional view illustrating the disposition and shapes of barrier portions in the electronic device according to the fifth modification example of the third embodiment of the present invention. In FIGS. 20 and 21, portions denoted by reference signs similar to the reference signs illustrated in FIG. 1 to 19 are similar portions, and thus, a detailed description thereof will be omitted.

The electronic device according to the fourth modification example of the third embodiment of the present invention illustrated in FIG. 20 is different from the electronic device according to the third embodiment in that the first barrier portion 18 of the first case member 11 and the second barrier portion 68 of the cover member 6 are disposed closer to a ground than the connector 5 when the electronic device is attached to the transmission case 131 of the vehicle 100. According to the configuration of the fourth modification example described above, it is possible to suppress the intrusion of the liquid containing the snow melting agent or the like and the foreign matter from the ground into the peripheral portion of the seal member 8 due to winding-up or the like during traveling.

On the other hand, the electronic device according to the fifth modification example of the third embodiment of the present invention illustrated in FIG. 21 is different from the electronic device according to the third embodiment in that, when the electronic device is attached to the transmission case 131 of the vehicle 100, a first barrier portion 18N of a first case member 11N and a second barrier portion 68N of a cover member 6N are disposed closer to the front side of the vehicle 100 with respect to the connector 5. According to the configuration of the fifth modification example described above, it is possible to suppress the intrusion of the liquid containing the snow melting agent or the like and the foreign matter into the peripheral portion of the seal member 8 from a traveling direction of the vehicle 100 by winding-up during traveling of the vehicle.

Figure 22:
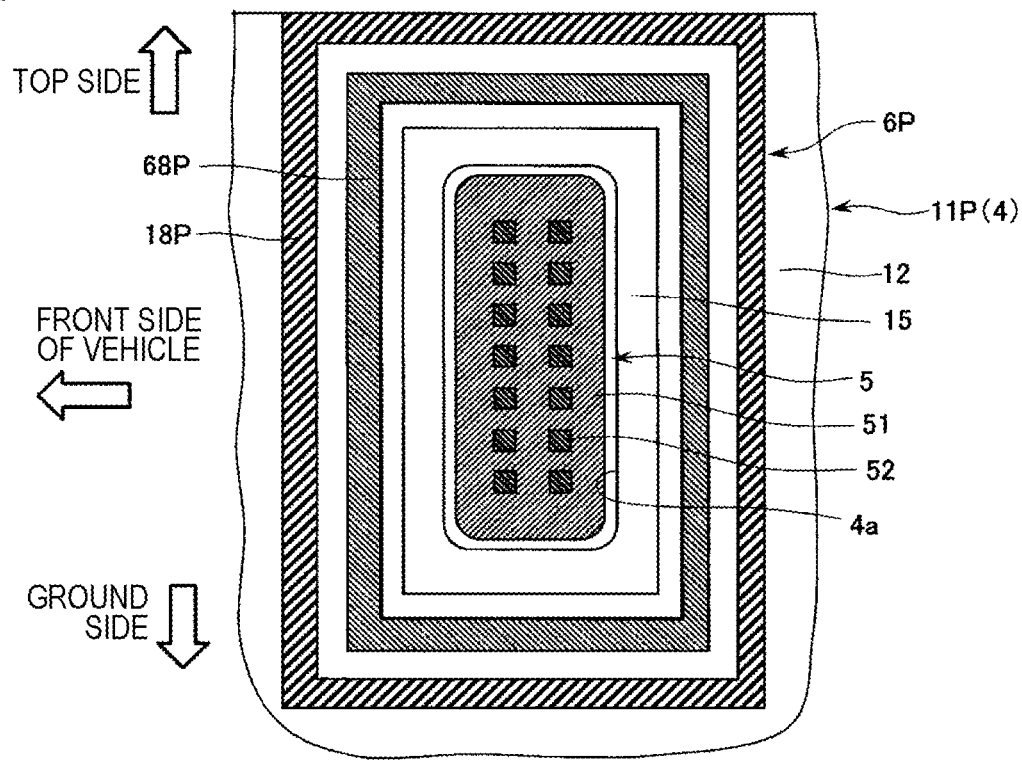
FIG. 22 is a cross-sectional view illustrating shapes of barrier portions in an electronic device according to a sixth modification example of the third embodiment of the present invention.

Next, a configuration and operational effects of the electronic device according to the sixth modification example of the third embodiment of the present invention will be described with reference to FIG. 22. FIG. 22 is a cross-sectional view illustrating shapes of barrier portions in the electronic device according to the sixth modification example of the third embodiment of the present invention. In FIG. 22, portions denoted by reference signs similar to the reference signs illustrated in FIGS. 1 to 21 are similar portions, and thus, a detailed description thereof will be omitted.

The electronic device according to the sixth modification example of the third embodiment of the present invention illustrated in FIG. 22 is different from the electronic device according to the third embodiment in that structures of a first barrier portion 18P of a first case member 11P and a second barrier portion 68P of a cover member 6P are different. A structure of each member other than the first case member 11P and the cover member 6P is similar to that of the third embodiment. Specifically, the first barrier portion 18P of the first case member 11P extends over the entire circumference of the connector 5 in a circumferential direction, and is disposed so as to cover an outer peripheral surface of the connector 5 at a distance. Similarly, the second barrier portion 68P of the cover member 6P extends over the entire circumference of the connector 5 in the circumferential direction, and is disposed so as to cover the outer peripheral surface of the connector 5 at a distance. That is, the first barrier portion 18P and the second barrier portion 68P are disposed such that wall surfaces thereof face each other over the entire circumference of the connector 5 in the circumferential direction, and a bent gap (labyrinth-shaped gap) is formed between the first case member 11P of the housing 4 and the cover member 6P over the entire circumference of the connector 5 in the circumferential direction. In other words, an outer peripheral side of the connector 5 is surrounded by the first barrier portion 18P and the second barrier portion 68P.

According to the electronic device according to the sixth modification example of the third embodiment of the present invention described above, since the first barrier portion 18P of the first case member 11P extends over the entire circumference of the connector 5 in the circumferential direction, it is possible to suppress the intrusion of the liquid containing the snow melting agent or the like and the foreign matter into the peripheral portion of the seal member 8 from all directions by winding-up during traveling of the vehicle.

According to the electronic device according to the sixth modification example of the third embodiment of the present invention described above, since the second barrier portion 68P of the cover member 6P extends over the entire circumference of the connector 5 in the circumferential direction, it is possible to suppress the intrusion of the liquid containing the snow melting agent or the like and the foreign matter into the peripheral portion of the seal member 8 from all directions by winding-up during traveling of the vehicle.

[Other Embodiments] In the first to third embodiments and the modification examples thereof described above, an example in which the electronic device of the present invention is applied to the transmission control device has been described. However, the present invention is applicable to an electronic device having a structure in which the connector 5 exposed to the outside of the housing 4 housing the circuit board 3 is fitted into the opening portion of the case member constituting a part of the case of the external device. For example, the present invention is also applicable to an electronic device including the connector such as the engine control device 110, the battery control device 112, or the power conversion device 106 described above.

The present invention is not limited to the aforementioned embodiments, and includes various modification examples. For example, the aforementioned embodiments are described in detail in order to facilitate easy understanding of the present invention, and are not limited to necessarily include all the described components. Some of the components of a certain embodiment can be substituted into the components of another embodiment, and the components of another embodiment can be added to the component of a certain embodiment. Additions, the components of another embodiment can be added, removed, and substituted to, from, and into some of the components of the aforementioned embodiments.

For example, it is possible to combine the second barrier portion 68A (see FIG. 7) in the first modification example of the first embodiment described above with any one of the first barrier portions 18B, 18C, and 18D (see FIGS. 8 to 10) in the second to fourth modification examples.

It is possible to combine the first barrier portion 18F (see FIG. 12) in the first modification example of the second embodiment and any one of second barrier portions 68G, 68H, and 68J (see FIGS. 13 to 15) in the second to fourth modification examples.

It is possible to combine any one of the first barrier portions 18K and 18L in the first and second modification examples of the third embodiment and the second barrier portion 68M (see FIG. 19) in the third modification example.

The shapes of the first barrier portion 18 and the second barrier portion 68 (see FIG. 20) according to the fourth modification example of the third embodiment can be replaced with the shapes of the first barrier portions 18K and 18L (see FIGS. 17 to 18) according to the first t second modification examples.

In the first to third embodiments and the modification examples thereof described above, an example of the configuration in which the first barrier portion of the first case member and the second barrier portion of the cover member are disposed such that the wall surfaces thereof face each other and the bent gap (labyrinth-shaped gap) L is formed between the first case member of the housing 4 and the cover member has been described. However, the first barrier portion of the first case member and the second barrier portion of the cover member may be disposed at different positions in the circumferential direction of the connector 5 without facing each other.

Figure 23:
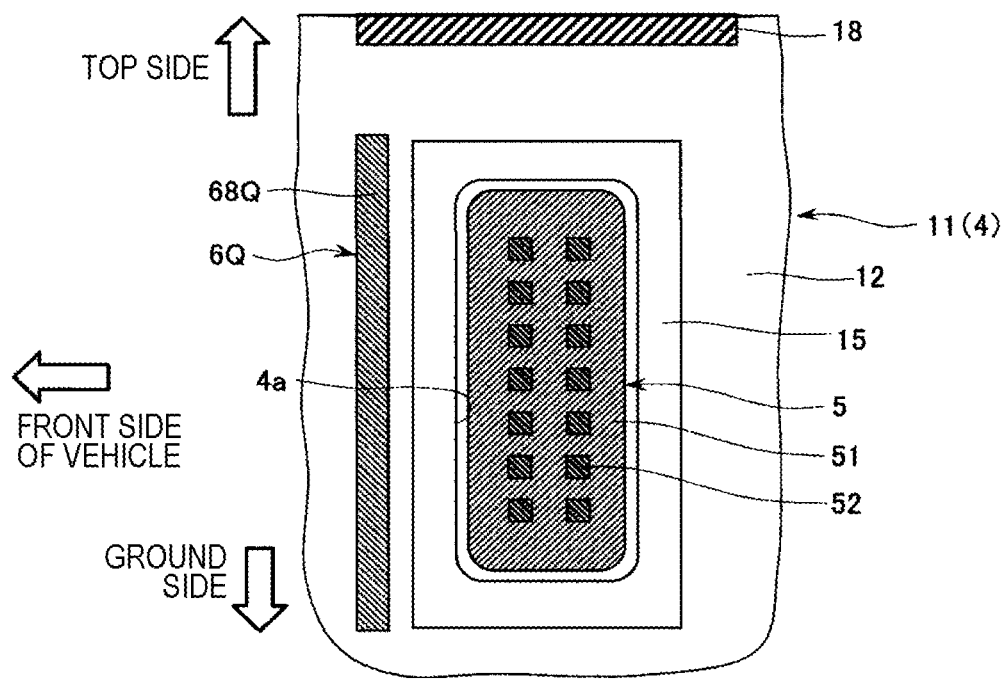
FIG. 23 is a cross-sectional view illustrating the disposition and shapes of barrier portions in an electronic device according to another embodiment of the present invention.

For example, as illustrated in FIG. 23, the first barrier portion 18 of the first case member 11 is disposed on the top in the circumferential direction of the connector 5, while a second barrier portion 68Q of a cover member 6Q is disposed closer to the front side of the vehicle 100 in the circumferential direction of the connector 5. FIG. 23 is a cross-sectional view illustrating the disposition of barrier portions in an electronic device according to another embodiment of the present invention. In this configuration, the first barrier portion 18 and the second barrier portion 68Q can prevent a path of a liquid such as salt water toward the seal member 8 interposed between the connector 5 and the cover member 6P and peripheral portions thereof.

Accordingly, the intrusion of the liquid into the seal member 8 and the periphery thereof is suppressed, and the salt damage resistance of the electronic device and the transmission 103 as the external device holding the electronic device can be enhanced.

In the first to third embodiments and the modification examples thereof described above, the example of the structure in which the first barrier portion of the housing 4 extends from the first bottom portion 12 of the first case member has been described. However, the first barrier portion may extend from a part of the second case member 21. Even with this configuration, effects similar to those of the first to third embodiments and the modification examples thereof can be obtained.

In the first modification example of the first embodiment and the second modification example of the second embodiment described above, an example of the configuration in which the distal end portion 683 of the second barrier portion 68A or 68G is positioned closer to the first barrier portion 18 or 18E than the root portion 684 by inclining the second barrier portion 68A or 68G itself has been described (see FIGS. 7 and 13). On the other hand, it is also possible to position the distal end portion 683 of the second barrier portion closer to the first barrier portion 18 or 18E than to the root portion 684 by forming the second barrier portion stepwise.

In the second modification example of the first embodiment and the first modification example of the second embodiment described above, an example of the configuration in which the distal end portions 183 of the first barrier portion 18B or 18F is positioned closer to the second barrier portion 68 or 68E than the root portion 184 by inclining the first barrier portion 18B or 18F itself has been described (see FIGS. 8 and 12). On the other hand, it is also possible to position the distal end portion 183 of the first barrier portion closer to the second barrier portion 68 or 68E than the root portion 184 by forming the first barrier portion stepwise.

REFERENCE SIGNS LIST 1, 1A, 1B, 1C, 1D, 1E, 1F, 1G, 1H, 1J transmission control device (electronic device)
2 electronic component
3 circuit board
4 housing
4a first opening portion
5 connector
6, 6A, 6E, 6G, 6H, 6J, 6M, 6N, 6P, 6Q cover member
8 seal member
18, 18B, 18C, 18D, 18E, 18F, 18K, 18L, 18N, 18P first barrier portion
66a second opening portion
68, 68A, 68E, 68G, 68H, 68J, 68M, 68N, 68P, 68Q second barrier portion
100 vehicle
103 transmission (external device)
131 transmission case (case)
181 first wall surface (wall surface)
182 second wall surface
183 distal end portion
184 root portion
185 central portion
186 side portion
681 first wall surface (wall surface)
682 second wall surface
683 distal end portion
684 root portion
685 central portion
686 side portion

The invention claimed is:

1. An electronic device, comprising:
a circuit board on which an electronic component is mounted;
a housing that has a first opening portion, and houses the circuit board;
a connector that is mounted on the circuit board, and is exposed to an outside of the housing via the first opening portion of the housing;
a cover member that constitutes a part of a case of an external device to hold the housing, and has a second opening portion to which the connector is fitted, wherein
the second opening portion is formed by a cylindrical portion provided in a bottom portion of the cover member so as to extend inward; and
a seal member that is interposed between the connector and the cover member, and liquid-tightly seals the case of the external device,
wherein the housing has a first barrier portion extending toward the cover member so as to cover a part of the connector at a distance, and the cover member has a second barrier portion extending toward the housing so as to cover a part of the connector at a distance.

2. The electronic device according to claim 1, wherein the first barrier portion of the housing and the second barrier portion of the cover member are disposed such that wall surfaces face each other, and a bent gap is formed between the housing and the cover member.

3. The electronic device according to claim 2, wherein the second barrier portion of the cover member is disposed at a position closer to the connector than the first barrier portion of the housing.

4. The electronic device according to claim 3, wherein the second barrier portion is formed such that a distal end portion is positioned closer to the first barrier portion than a root portion.

5. The electronic device according to claim 3, wherein the second barrier portion is inclined such that a distal end portion is positioned gradually closer to the connector from a distal end portion toward a root portion.

6. The electronic device according to claim 3, wherein the first barrier portion is formed such that a distal end portion is positioned closer to the second barrier portion than a root portion.

7. The electronic device according to claim 3, wherein the first barrier portion is inclined so as to be positioned gradually closer to the connector from a root portion toward a distal end portion.

8. The electronic device according to claim 3, wherein a second wall surface of the first barrier portion on an opposite side to a first wall surface facing the second barrier portion is formed on an inclined surface such that a distal end side is positioned closer to the connector than a root side.

9. The electronic device according to claim 3, wherein the first barrier portion is inclined so as to be positioned gradually closer to the connector from a distal end portion toward a root portion.

10. The electronic device according to claim 3, wherein the housing is disposed closer to a front side of a vehicle than the cover member when the electronic device is attached to the vehicle.

11. The electronic device according to claim 2, wherein the first barrier portion of the housing is disposed at a position closer to the connector than the second barrier portion of the cover member.

12. The electronic device according to claim 11, wherein the first barrier portion is formed such that a distal end portion is positioned closer to the second barrier portion than a root portion.

13. The electronic device according to claim 11, wherein the first barrier portion is inclined so as to be positioned gradually closer to the connector from a distal end portion toward a root portion.

14. The electronic device according to claim 11, wherein the second barrier portion is formed such that a distal end portion is positioned closer to the first barrier portion than a root portion.

15. The electronic device according to claim 11, wherein the second barrier portion is inclined so as to be positioned gradually closer to the connector from a root portion toward a distal end portion.

16. The electronic device according to claim 11, wherein a second wall surface of the second barrier portion on an opposite side to a first wall surface facing the first barrier portion is formed on an inclined surface such that a distal end side is positioned closer to the connector than a root side.

17. The electronic device according to claim 11, wherein the second barrier portion is inclined so as to be positioned gradually closer to the connector from a distal end portion toward a root portion.

18. The electronic device according to claim 11, wherein the cover member is disposed closer to a front side of a vehicle than the housing when the electronic device is attached to the vehicle.

19. The electronic device according to claim 1, wherein the first barrier portion is disposed closer to a top side than the connector when the electronic device is attached to a vehicle.

20. The electronic device according to claim 19, wherein the first barrier portion is inclined such that a cross-sectional shape of a surface orthogonal in an extending direction is positioned gradually closer to a ground from a central portion toward both side portions.

21. The electronic device according to claim 19, wherein the first barrier portion is formed in an arc shape in which a cross-sectional shape of a surface orthogonal in an extending direction has a central portion as an uppermost portion.

22. The electronic device according to claim 1, wherein the second barrier portion is disposed closer to a top than the connector when the electronic device is attached to a vehicle.

23. The electronic device according to claim 22, wherein the second barrier portion is inclined such that a cross-sectional shape of a surface orthogonal in an extending direction is positioned gradually closer to a ground from a central portion toward both side portions.

24. The electronic device according to claim 22, wherein the second barrier portion is formed in an arc shape in which a cross-sectional shape of a surface orthogonal in an extending direction has a central portion as an uppermost portion.

25. The electronic device according to claim 1, wherein the first barrier portion is disposed closer to a ground than the connector when the electronic device is attached to a vehicle.

26. The electronic device according to claim 1, wherein the second barrier portion is disposed closer to a ground than the connector when the electronic device is attached to a vehicle.

27. The electronic device according to claim 1, wherein the first barrier portion is disposed closer to a front side of a vehicle than the connector when the electronic device is attached to the vehicle.

28. The electronic device according to claim 1, wherein the second barrier portion is disposed closer to a front side of a vehicle than the connector when the electronic device is attached to the vehicle.

29. The electronic device according to claim 1, wherein the first barrier portion extends over an entire circumference of the connector in a circumferential direction.

30. The electronic device according to claim 1, wherein the second barrier portion extends over an entire circumference of the connector in a circumferential direction.

31. The electronic device according to claim 1, wherein the seal member is rubber packing.

32. The electronic device according to claim 1, wherein the cover member is made of ADC12.

* * * * *